(12) United States Patent
Aoi

(10) Patent No.: US 6,197,696 B1
(45) Date of Patent: Mar. 6, 2001

(54) METHOD FOR FORMING INTERCONNECTION STRUCTURE

(75) Inventor: Nobuo Aoi, Hyogo (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/274,114

(22) Filed: Mar. 23, 1999

(30) Foreign Application Priority Data

Mar. 26, 1998  (JP) ................................................ 10-079371

(51) Int. Cl.$^7$ ................................................ H01L 21/311
(52) U.S. Cl. ............................................ 438/700; 438/706
(58) Field of Search ..................................... 438/700, 706

(56) References Cited

U.S. PATENT DOCUMENTS

| | | | |
|---|---|---|---|
| 5,110,712 | 5/1992 | Kessler et al. ................. | 438/623 |
| 5,518,963 | * 5/1996 | Park ............................. | 438/624 |
| 5,635,423 | * 6/1997 | Huang et al. ................. | 438/638 |
| 5,651,855 | 7/1997 | Dennison et al. ............ | 438/628 |
| 5,702,982 | * 12/1997 | Lee et al. ...................... | 438/620 |

FOREIGN PATENT DOCUMENTS

| | | | |
|---|---|---|---|
| 0 425 787 A2 | 5/1991 | (EP) | H01L/21/90 |
| 0 680 085 A1 | 11/1995 | (EP) | H01L/21/768 |
| 6-291193 | 10/1994 | (JP) | H01L/21/90 |
| 7-153842 | 6/1995 | (JP) | H01L/21/768 |
| 9-64034 | 3/1997 | (JP) | H01L/21/3205 |
| 9-153545 | 6/1997 | (JP) | H01L/21/768 |

OTHER PUBLICATIONS

European Search Report dated Jul. 1, 1999.

* cited by examiner

Primary Examiner—Benjamin L. Utech
Assistant Examiner—Lynette T. Umez-Eronini
(74) Attorney, Agent, or Firm—Eric J. Robinson; Nixon Peabody LLP

(57) ABSTRACT

In a method for forming an interconnection structure, first, second and third insulating films and a thin film are sequentially formed over lower-level metal interconnects. Then, the thin film is masked with a first resist pattern and etched to form a mask pattern with openings for interconnects. Next, the third insulating film is masked with a second resist pattern and dry-etched such that the third insulating film and the first and second resist patterns are etched at a high rate and that the second insulating film is etched at a low rate to form openings for contact holes in the third insulating film and remove the first and second resist patterns. Then, the second insulating film is masked with the third insulating film and dry-etched such that the second insulating film is etched at a high rate and that the first and third insulating films are etched at a low rate to form the openings for contact holes in the second insulating film. Then, the third and first insulating films are masked with the mask pattern and the second insulating film, respectively, and dry-etched such that the first and third insulating films are etched at a high rate and that the mask pattern and the second insulating film are etched at a low rate to form wiring grooves and contact holes in the third and first insulating films, respectively. Finally, upper-level metal interconnects and contacts are formed.

15 Claims, 37 Drawing Sheets

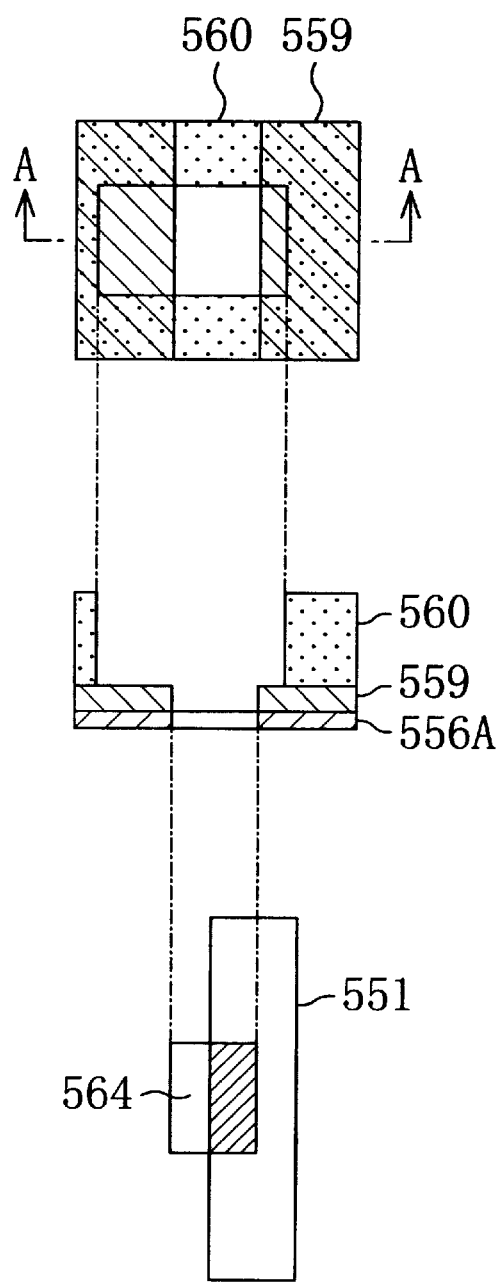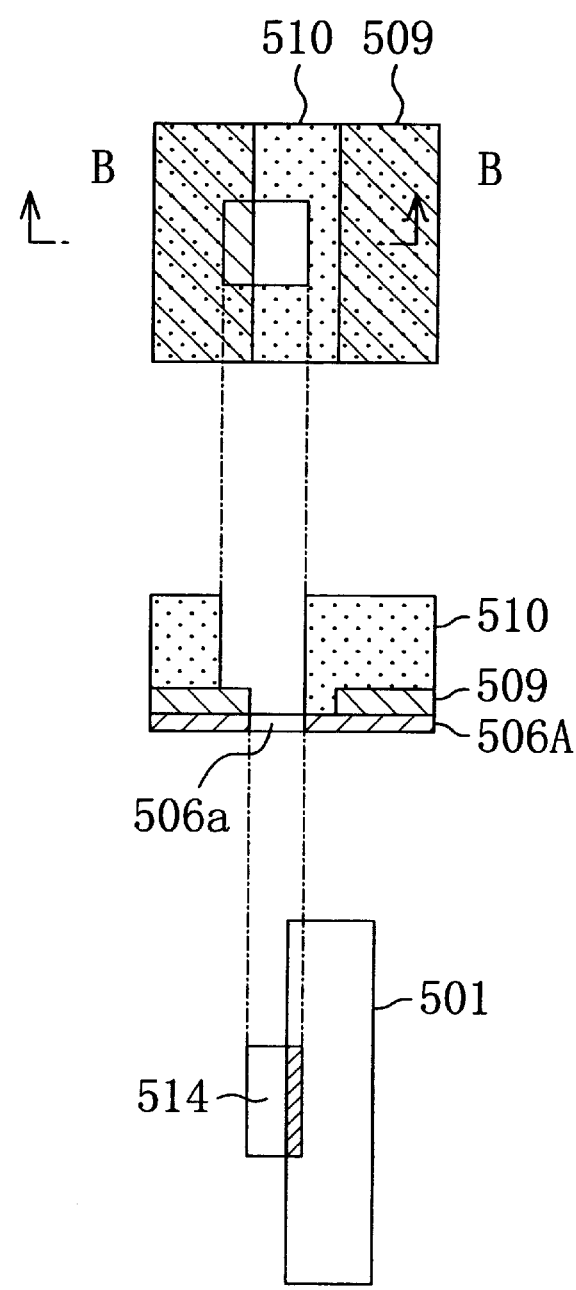

METHOD FOR FORMING INTERCONNECTION STRUCTURE

BACKGROUND OF THE INVENTION

The present invention relates to a method for forming an interconnection structure in a semiconductor integrated circuit.

As the number of devices, integrated within a single semiconductor integrated circuit, has been tremendously increasing these days, wiring delay has also been increasing noticeably. This is because the larger the number of devices integrated, the larger line-to-line capacitance (i.e., parasitic capacitance between metal interconnects), thus interfering with the performance improvement of a semiconductor integrated circuit. The wiring delay is so-called "RC delay", which is proportional to the product of the resistance of metal interconnection and the line-to-line capacitance.

In other words, to reduce the wiring delay, either the resistance of metal interconnection or the line-to-line capacitance should be reduced.

In order to reduce the interconnection resistance, IBM Corp., Motorola, Inc., etc. have reported semiconductor integrated circuits using copper, not aluminum alloy, as a material for metal interconnects. A copper material has a specific resistance about two-thirds as high as that of an aluminum alloy material. Accordingly, in accordance with simple calculation, the wiring delay involved with the use of a copper material for metal interconnects can be about two-thirds of that involved with the use of an aluminum alloy material therefor. That is to say, the operating speed can be increased by about 1.5 times.

However, the number of devices, integrated within a single semiconductor integrated circuit, is expected to further increase by leaps and bounds from now on, thus increasing the wiring delay considerably. Therefore, it is concerned that even the use of copper as an alternate metal interconnection material would not be able to catch up with such drastic increase. Also, the specific resistance of copper as a metal interconnection material is just a little bit higher than, but almost equal to, that of gold or silver. Accordingly, even if gold or silver is used instead of copper as a metal interconnection material, the wiring delay can be reduced only slightly.

Under these circumstances, not only reducing interconnection resistance but also suppressing line-to-line capacitance play a key role in further increasing the number of devices that can be integrated within a single semiconductor integrated circuit. And the relative dielectric constant of an interlevel insulating film should be reduced to suppress the line-to-line capacitance. A silicon dioxide film has heretofore been used as a typical material for an interlevel insulating film. The relative dielectric constant of a silicon dioxide film is, however, about 4 to about 4.5. Thus, it would be difficult to apply a silicon dioxide film to a semiconductor integrated circuit incorporating an even larger number of devices.

In order to solve such a problem, fluorine-doped silicon dioxide film, low-dielectric-constant spin-on-glass (SOG) film, organic polymer film and so on have been proposed as alternate interlevel insulating films with respective relative dielectric constants smaller than that of a silicon dioxide film.

The relative dielectric constant of a fluorine-doped silicon dioxide film is about 3.3 to about 3.7, which is about 20 percent lower than that of a conventional silicon dioxide film. Nevertheless, a fluorine-doped silicon dioxide film is highly hygroscopic, and easily absorbs water in the air, resulting in various problems in practice. For example, when the fluorine-doped silicon dioxide film absorbs water, SiOH groups, having a high relative dielectric constant, are introduced into the film. As a result, the relative dielectric constant of the fluorine-doped silicon dioxide film adversely increases, or the SiOH groups react with the water during a heat treatment to release $H_2O$ gas. In addition, fluorine free radicals, contained in the fluorine-doped silicon dioxide film, segregate near the surface thereof during a heat treatment and react with Ti, contained in a TiN layer formed thereon as an adhesion layer, to form a TiF film, which easily peels off.

An HSQ (hydrogen silsesquioxane) film, composed of Si, O and H atoms, is an exemplary low-dielectric-constant SOG film. In the HSQ film, the number of the H atoms is about two-thirds of that of the O atoms. However, the HSQ film releases a larger amount of water than a conventional silicon dioxide film. Accordingly, since it is difficult to form a buried interconnection line in the HSQ film, a patterned metal film should be formed as metal interconnects on the HSQ film.

Also, since the HSQ film cannot adhere so strongly to metal interconnects, a CVD oxide film should be formed between the metal interconnects and the HSQ film to improve the adhesion therebetween. However, in such a case, if the CVD oxide film is formed on the metal interconnects, then the substantial line-to-line capacitance is equal to the serial capacitance formed by the HSQ and CVD films. This is because the CVD oxide film with a high dielectric constant exists between the metal interconnects. Accordingly, the resulting line-to-line capacitance is larger as compared with using the HSQ film alone.

An organic polymer film, as well as the low-dielectric-constant SOG film, cannot adhere strongly to metal interconnects, either. Accordingly, a CVD oxide film should be formed as an adhesion layer between the metal interconnects and the organic polymer film, too.

Moreover, an etch rate, at which an organic polymer film is etched, is approximately equal to an ash rate, at which a resist pattern is ashed with oxygen plasma. Accordingly, a usual resist application process is not applicable in such a situation, because the organic polymer film is likely to be damaged during ashing and removing the resist pattern. Therefore, a proposed alternate process includes: forming a CVD oxide film on an organic polymer film; forming a resist film on the CVD oxide film; and then etching the resist film using the CVD oxide film as an etch stopper, or a protective film.

However, during the step of forming the CVD oxide film on the organic polymer film, the surface of the organic polymer film is exposed to a reactive gas containing oxygen. Accordingly, the organic polymer film reacts with oxygen to take in polar groups such as carbonyl groups and ketone groups. As a result, the relative dielectric constant of the organic polymer film disadvantageously increases.

Also, in forming inlaid copper interconnects in the organic polymer film, a TiN adhesion layer, for example, should be formed around wiring grooves formed in the organic polymer film, because the organic polymer film cannot adhere strongly to the metal interconnects. However, since the TiN film has a high resistance, the effective cross-sectional area of the metal interconnects decreases. Consequently, the intended effect attainable by the use of the copper lines, i.e., reduction in resistance, would be lost.

SUMMARY OF THE INVENTION

An object of the present invention is providing a method for forming an interconnection structure in which an insulating film with a low dielectric constant can be formed by an ordinary resist application process.

A first method for forming an interconnection structure according to the present invention includes the steps of: a) forming a first insulating film over lower-level metal interconnects; b) forming a second insulating film, having a different composition than that of the first insulating film, over the first insulating film; c) forming a third insulating film, having a different composition than that of the second insulating film, over the second insulating film; d) forming a thin film over the third insulating film; e) forming a first resist pattern, having a plurality of openings for forming wiring grooves, on the thin film; f) etching the thin film using the first resist pattern as a mask, thereby forming a mask pattern out of the thin film to have the openings for forming wiring grooves; g) forming a second resist pattern, having a plurality of openings for forming contact holes, on the third insulating film; h) dry-etching the third insulating film under such conditions that the third insulating film and the first and second resist patterns are etched at a relatively high rate and that the second insulating film is etched at a relatively low rate, thereby patterning the third insulating film to have the openings for forming contact holes and removing the first and second resist patterns either entirely or partially with respective lower parts thereof left; i) dry-etching the second insulating film using the patterned third insulating film as a mask under such conditions that the second insulating film is etched at a relatively high rate and that the first and third insulating films are etched at a relatively low rate, thereby patterning the second insulating film to have the openings for forming contact holes; j) dry-etching the third and first insulating films using the mask pattern and the patterned second insulating film as respective masks under such conditions that the first and third insulating films are etched at a relatively high rate and that the mask pattern and the second insulating film are etched at a relatively low rate, thereby forming wiring grooves and contact holes in the third and first insulating films, respectively; and k) filling in the wiring grooves and the contact holes with a metal film, thereby forming upper-level metal interconnects and contacts connecting the lower- and upper-level metal interconnects together.

In the first method of the present invention, the third insulating film is dry-etched under such conditions that the third insulating film and the first and second resist patterns are etched at a relatively high rate and that the second insulating film is etched at a relatively low rate, thereby patterning the third insulating film and removing the first and second resist patterns in the step h). Accordingly, it is not necessary to perform the step of ashing and removing the first and second resist patterns with oxygen plasma. In other words, since it is possible to prevent the third insulating film from being damaged during ashing and removing a resist pattern, a low-dielectric-constant insulating film, which would otherwise be damaged easily by oxygen plasma, may be used as the third insulating film. As a result, an interlevel insulating film with a low dielectric constant can be formed by an ordinary resist application process.

In addition, the second insulating film can be used as an etch stopper while the wiring grooves are formed by dry-etching the third insulating film using the mask pattern as a mask in the step j). Accordingly, the depth of each wiring groove can be equalized with the thickness of the third insulating film. That is to say, the depth of the wiring grooves can be defined by self-alignment.

Moreover, the composition of the second insulating film is different from that of the third insulating film. Thus, the second insulating film can be used as an etch stopper while the wiring grooves are formed by dry-etching the third insulating film using the mask pattern as a mask in the step j).

In one embodiment of the present invention, the first method preferably further includes the step of forming a metal adhesion layer over part of the third insulating film exposed inside the wiring grooves and part of the first insulating film exposed inside the contact holes between the steps j) and k).

In such an embodiment, the adhesion between the upper-level metal interconnects and the third insulating film and between the contacts and the first insulating film can be improved.

In another embodiment of the present invention, the third insulating film is preferably mainly composed of an organic component.

In such an embodiment, the conditions employed in the step h), i.e., that the third insulating film and the first and second resist patterns are etched at a relatively high rate and that the second insulating film is etched at a relatively low rate, are realized with much more certainty.

In this embodiment, the step c) preferably includes forming the third insulating film by a CVD process using a reactive gas containing perfluorodecalin.

Then, a film mainly composed of an organic component and having a low relative dielectric constant can be formed as the third insulating film with a lot more certainty.

In another embodiment, the first insulating film is also preferably mainly composed of an organic component.

Then, the conditions employed in the step i), i.e., that the second insulating film is etched at a relatively high rate and that the first and third insulating films are etched at a relatively low rate, are realized with much more certainty. At the same time, the conditions employed in the step j), i.e., that the first and third insulating films are etched at a relatively high rate and that the mask pattern and the second insulating film are etched at a relatively low rate, are also realized with much more certainty.

In an embodiment where the first and third insulating films are both mainly composed of organic components, the first method preferably further includes the step of forming an adhesion layer over part of the third insulating film exposed inside the wiring grooves and part of the first insulating film exposed inside the contact holes by a plasma process using a reactive gas containing nitrogen between the steps j) and k).

In such a case, the adhesion between the upper-level metal interconnects and the third insulating film mainly composed of an organic component, and between the contacts and the first insulating film mainly composed of an organic component can be improved substantially without fail.

In the embodiment where the first insulating film is mainly composed of an organic component, the step a) preferably includes forming the first insulating film by a CVD process using a reactive gas containing perfluorodecalin.

In such a case, a film mainly composed of an organic component and having a low relative dielectric constant can be formed as the first insulating film with a lot more certainty.

A second method for forming an interconnection structure according to the present invention includes the steps of: a) forming a first insulating film over lower-level metal interconnects; b) forming a second insulating film, having a different composition than that of the first insulating film, over the first insulating film; c) forming a third insulating film, having a different composition than that of the second insulating film, over the second insulating film; d) forming a thin film over the third insulating film; e) forming a first resist pattern, having a plurality of openings for forming wiring grooves, on the thin film; f) etching the thin film using the first resist pattern as a mask, thereby forming a mask pattern out of the thin film to have the openings for forming wiring grooves; g) forming a second resist pattern, having a plurality of openings for forming contact holes, on the third insulating film; h) dry-etching the third insulating film using the first and second resist patterns as a mask under such conditions that the third insulating film is etched at a relatively high rate and that the second insulating film and the first and second resist patterns are etched at a relatively low rate, thereby patterning the third insulating film to have the openings for forming contact holes; i) dry-etching the second insulating film using the first and second resist patterns as a mask under such conditions that the second insulating film is etched at a relatively high rate and that the first and third insulating films and the first and second resist patterns are etched at a relatively low rate, thereby patterning the second insulating film to have the openings for forming contact holes; j) removing the first and second resist patterns; k) dry-etching the third and first insulating films using the mask pattern and the patterned second insulating film as respective masks under such conditions that the first and third insulating films are etched at a relatively high rate and that the mask pattern and the second insulating film are etched at a relatively low rate, thereby forming wiring grooves and contact holes in the third and first insulating films, respectively; and l) filling in the wiring grooves and the contact holes with a metal film, thereby forming upper-level metal interconnects and contacts connecting the lower- and upper-level metal interconnects together.

In the second method of the present invention, even if a damaged layer is formed in respective parts of the first and third insulating films that are exposed inside the openings for forming contact holes in the second insulating film during the step j) of removing the first and second resist patterns, the damaged layer can be removed without fail in the next step k). In this step, the third and first insulating films are dry-etched using the mask pattern and the patterned second insulating film as respective masks under such conditions that the first and third insulating films are etched at a relatively high rate and that the mask pattern and the second insulating film are etched at a relatively low rate, thereby forming wiring grooves and contact holes in the third and first insulating films, respectively. Accordingly, low-dielectric-constant insulating films, which would otherwise be damaged easily by oxygen plasma, can be used as the first and third insulating films. As a result, an interlevel insulating film with a low dielectric constant can be formed by an ordinary resist application process.

In one embodiment of the present invention, the third insulating film is preferably a low-dielectric-constant SOG film with a siloxane skeleton.

In such an embodiment, an interlevel insulating film with a low dielectric constant can be formed by an ordinary resist application process.

A third method for forming an interconnection structure according to the present invention includes the steps of: a) forming a first insulating film over lower-level metal interconnects; b) forming a second insulating film, having a different composition than that of the first insulating film, over the first insulating film; c) forming a third insulating film, having a different composition than that of the second insulating film, over the second insulating film; d) forming a fourth insulating film, having a different composition than that of the third insulating film, over the third insulating film; e) forming a thin film over the fourth insulating film; f) forming a first resist pattern on the thin film, the first resist pattern having openings for forming wiring grooves; g) etching the thin film using the first resist pattern as a mask, thereby forming a mask pattern out of the thin film to have the openings for forming wiring grooves; h) removing the first resist pattern and then forming a second resist pattern on the fourth insulating film and the mask pattern, the second resist pattern having openings for forming contact holes; i) dry-etching the fourth insulating film using the second resist pattern and the mask pattern as a mask, thereby patterning the fourth insulating film to have the openings for forming contact holes; j) dry-etching the third insulating film using the patterned fourth insulating film as a mask, thereby patterning the third insulating film to have the openings for forming contact holes; k) dry-etching the patterned fourth insulating film and the second insulating film using the mask pattern and the patterned third insulating film as respective masks, thereby forming wiring grooves in the patterned fourth insulating film and patterning the second insulating film to have the openings for forming contact holes; l) dry-etching the patterned third insulating film and the first insulating film using the mask pattern and the patterned second insulating film as respective masks, thereby forming the wiring grooves and the contact holes in the patterned third insulating film and the first insulating film, respectively; and m) filling in the wiring grooves and the contact holes with a metal film, thereby forming upper-level metal interconnects and contacts connecting the lower- and upper-level metal interconnects together.

In the third method of the present invention, the fourth insulating film exists on the third insulating film during the removal of the first resist pattern in the step h). Accordingly, even if the first resist pattern is removed by oxygen plasma, the third insulating film is not damaged. Also, the second insulating film exists on the first insulating film during dry-etching the third insulating film in the step j). Accordingly, the first insulating film is not damaged, either. Thus, low-dielectric-constant insulating films, which would otherwise be damaged easily by oxygen plasma or dry etching, can be used as the first and third insulating films. As a result, an interlevel insulating film with a low dielectric constant can be formed by an ordinary resist application process.

In one embodiment of the present invention, at least one of the first and third insulating films is preferably mainly composed of an organic component.

In such an embodiment, the relative dielectric constant of the interlevel insulating film can be reduced.

In another embodiment of the present invention, a size of the openings of the second resist pattern for forming contact holes is preferably larger than a designed size of the contact holes in a direction vertical to a direction in which the upper-level metal interconnects extend.

In such an embodiment, even if the openings of the second resist pattern for forming contact holes have misaligned with the openings of the mask pattern for forming wiring grooves, the openings of the patterned fourth insulating film for forming contact holes can be formed to be self-aligned with the openings of the mask pattern for forming wiring grooves. This is because the openings of the patterned fourth insulating film for forming contact holes are formed in respective regions where the openings of the second resist pattern for forming contact holes overlap with corresponding openings of the mask pattern for forming wiring grooves. As a result, the connection between the contacts and the upper-level metal interconnects is ensured.

A fourth method for forming an interconnection structure according to the present invention includes the steps of: a) forming a first insulating film over lower-level metal interconnects; b) forming a second insulating film, having a different composition than that of the first insulating film, over the first insulating film; c) forming a third insulating film, having a different composition than that of the second insulating film, over the second insulating film; d) forming a thin film over the third insulating film; e) forming a first resist pattern on the thin film, the first resist pattern having openings for forming wiring grooves; f) etching the thin film using the first resist pattern as a mask, thereby forming a mask pattern out of the thin film to have the openings for forming wiring grooves; g) removing the first resist pattern and then forming a second resist pattern on the third insulating film and the mask pattern, the second resist pattern having openings for forming contact holes; h) dry-etching the third insulating film using the second resist pattern and the mask pattern as a mask, thereby patterning the third insulating film to have the openings for forming contact holes; i) dry-etching the second insulating film using the patterned third insulating film as a mask, thereby patterning the second insulating film to have the openings for forming contact holes; j) dry-etching the patterned third insulating film and the first insulating film using the mask pattern and the patterned second insulating film as respective masks, thereby forming wiring grooves and contact holes in the patterned third insulating film and the first insulating film, respectively; and k) filling in the wiring grooves and the contact holes with a metal film, thereby forming upper-level metal interconnects and contacts connecting the lower- and upper-level metal interconnects together.

In the fourth method of the present invention, the second insulating film exists on the first insulating film during dry-etching the third insulating film in the step h). Accordingly, the first insulating film is not damaged. Thus, low-dielectric-constant insulating films, which would otherwise be damaged easily by oxygen plasma or dry etching, can be used as the first and third insulating films. As a result, an interlevel insulating film with a low dielectric constant can be formed by an ordinary resist application process.

In one embodiment of the present invention, at least one of the first and third insulating films is preferably mainly composed of an organic component.

In such an embodiment, the relative dielectric constant of the interlevel insulating film can be reduced.

In another embodiment of the present invention, a size of the openings of the second resist pattern for forming contact holes is preferably larger than a designed size of the contact holes in a direction vertical to a direction in which the upper-level metal interconnects extend.

In such an embodiment, even if the openings of the second resist pattern for forming contact holes have misaligned with the openings of the mask pattern for forming wiring grooves, the openings of the patterned third insulating film for forming contact holes can be formed to be self-aligned with the openings of the mask pattern for forming wiring grooves. This is because the openings of the patterned third insulating film for forming contact holes are formed in respective regions where the openings of the second resist pattern for forming contact holes overlap with corresponding openings of the mask pattern for forming wiring grooves. As a result, the connection between the contacts and the upper-level metal interconnects is ensured.

BRIEF DESCRIPTION OF THE DRAWINGS

FIG. 37(*a*) illustrates respective positional relationships between the mask pattern and the second resist pattern and between a first metal interconnect and an associated contact in the modified example of the fifth embodiment; and FIG. 37(*b*) illustrates respective positional relationships between the mask pattern and the second resist pattern and between a first metal interconnect and an associated contact in the fifth embodiment.

DESCRIPTION OF THE PREFERRED EMBODIMENTS

EMBODIMENT 1

Hereinafter, an exemplary method for forming an interconnection structure according to the first embodiment of the present invention will be described with reference to FIGS. 1(*a*) through 1(*c*), FIGS. 2(*a*) through 2(*c*) and FIGS. 3(*a*) through 3(*c*).

Figure 1A:
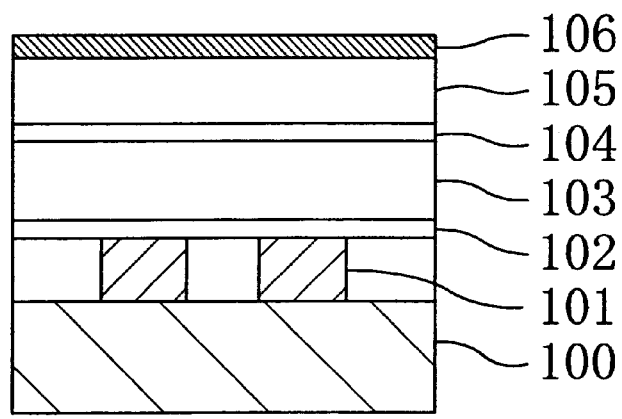
FIGS. 1(a) through 1(c) are cross-sectional views illustrating respective process steps for forming an interconnection structure according to the first embodiment of the present invention.

First, as shown in FIG. 1(*a*), a silicon nitride film 102 is formed over first metal interconnects 101 formed on a semiconductor substrate 100. The silicon nitride film 102 is formed to be 50 nm thick, for example, and used to protect the first metal interconnects 101 during a subsequent etching process step. Thereafter, a first organic film 103 (first insulating film), mainly composed of an organic component, is formed to be 1 μm thick, for example, on the silicon nitride film 102. Next, an organic-containing silicon dioxide film 104 (second insulating film), containing an organic component in silicon dioxide, is formed to be 50 nm thick, for example, on the first organic film 103. Then, a second organic film 105 (third insulating film), mainly composed of an organic component, is formed to be 400 nm thick, for example, on the organic-containing silicon dioxide film 104. And a titanium nitride film 106 is formed to be 50 nm thick, for example, on the second organic film 105.

The first and second organic films 103 and 105 may be deposited by any arbitrary technique. For example, these films 103 and 105 may be deposited by a plasma CVD process using a reactive gas mainly composed of perfluorodecalin. Also, hydrocarbon films or fluorine-containing hydrocarbon films, formed by plasma CVD, coating or thermal CVD, may be used as the first and second organic films 103 and 105.

Moreover, the first organic film 103 may be deposited by a plasma CVD process using a reactive gas mainly composed of perfluorodecalin and organic silane such as hexamethyl disiloxane, arylalkoxy silane or alkylalkoxy silane. In such a case, an organic/inorganic hybrid film can be obtained.

Similarly, the organic-containing silicon dioxide film 104 may also be deposited by any arbitrary technique. For instance, the film 104 may be deposited by a CVD process using a reactive gas mainly composed of phenyltrimethoxy silane. In such a case, an organic-containing silicon dioxide film 104, having a structure in which a phenyl group bonded to a silicon atom is introduced into silicon dioxide, can be obtained.

It should be noted that a thin film showing high etch selectivity with respect to the first and second organic films 103 and 105 and the organic-containing silicon dioxide film 104, i.e., a film etched at a sufficiently low rate (e.g., silicon nitride film), may be used instead of the titanium nitride film 106.

Figure 1B:
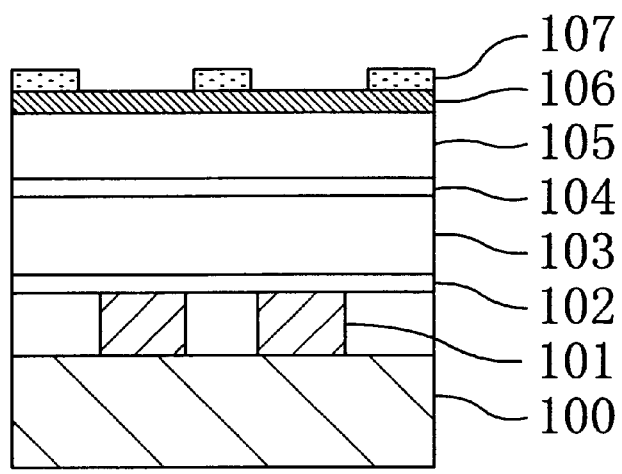
Figure 1C:
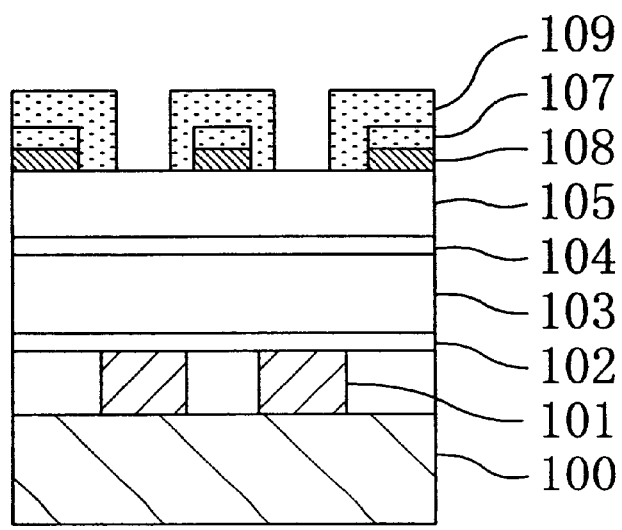

Next, as shown in FIG. 1(b), a first resist pattern 107, having openings for forming wiring grooves, is formed by lithography on the titanium nitride film 106. Thereafter, the titanium nitride film 106 is dry-etched using the first resist pattern 107 as a mask, thereby forming a mask pattern 108 out of the titanium nitride film 106 as shown in FIG. 1(c).

Figure 2A:
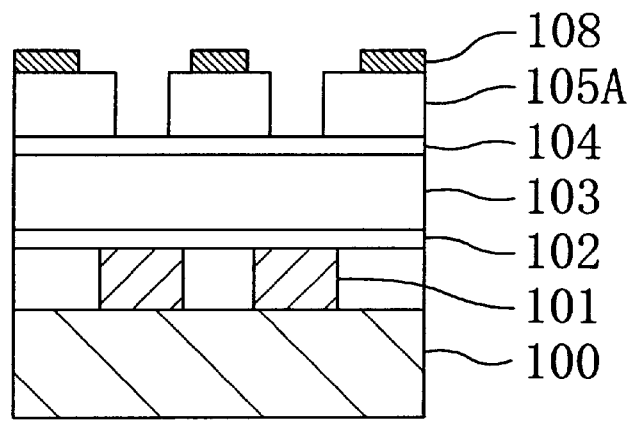
FIGS. 2(a) through 2(c) are cross-sectional views illustrating respective process steps for forming the interconnection structure of the first embodiment.

Subsequently, a second resist pattern 109, having openings for forming contact holes, is formed by lithography on the second organic film 105 without removing the first resist pattern 107. Then, the second organic film 105 is dry-etched, thereby forming a patterned second organic film 105A having the openings for forming contact holes as shown in FIG. 2(a). In this case, since the second organic film 105 and the first and second resist patterns 107 and 109 are all mainly composed of organic components, the second organic film 105 is etched at a substantially equal rate to that of the first and second resist patterns 107 and 109. Thus, when the second organic film 105 is dry-etched, the first and second resist patterns 107 and 109 are also removed simultaneously.

It should be noted that part of the second resist pattern 109 may be left in the process step of dry-etching the second organic film 105. This is because the residual second resist pattern 109 can be removed during a subsequent process step of forming wiring grooves 111 in the patterned second organic film 105A (see FIG. 2(c)).

Figure 2B:
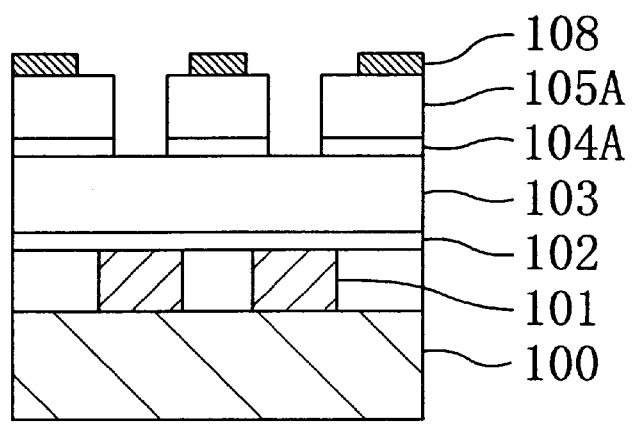

Then, the organic-containing silicon dioxide film 104 is dry-etched using the patterned second organic film 105A as a mask, thereby forming a patterned organic-containing silicon dioxide film 104A having the openings for forming contact holes as shown in FIG. 2(b). In this process step, by selecting such etching conditions that the organic-containing silicon dioxide film 104 is etched at a rate higher than that of the patterned second organic film 105A, it is possible to prevent the patterned second organic film 105A from being erroneously etched.

Figure 2C:
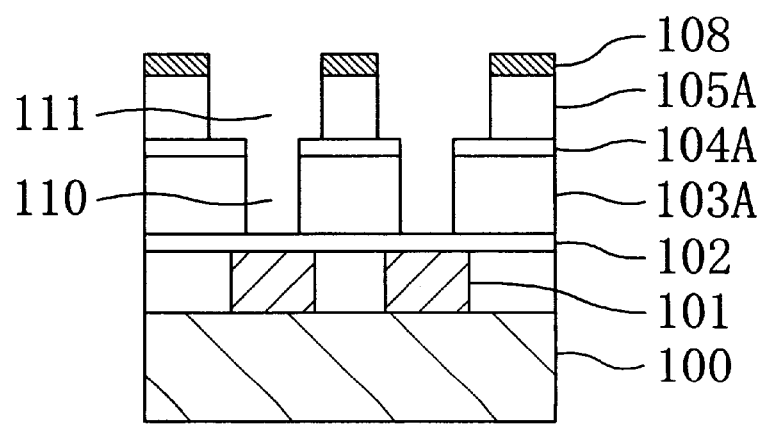

Next, the patterned second organic film 105A is dry-etched using the mask pattern 108 as a mask, thereby forming the wiring grooves 111 in the patterned second organic film 105A as shown in FIG. 2(c). At the same time, the first organic film 103 is also dry-etched using the patterned organic-containing silicon dioxide film 104A as a mask, thereby forming a patterned first organic film 103A having the contact holes as shown in FIG. 2(c).

Figure 3A:
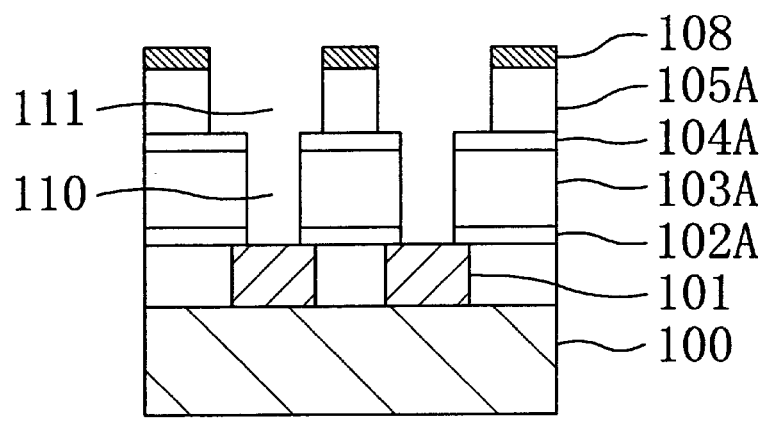
FIGS. 3(a) through 3(c) are cross-sectional views illustrating respective process steps for forming the interconnection structure of the first embodiment.

Subsequently, the silicon nitride film 102 is dry-etched using the patterned organic-containing silicon dioxide film 104A as a mask, thereby forming a patterned silicon nitride film 102A and exposing the first metal interconnects 101 within the contact holes 110 as shown in FIG. 3(a).

Figure 3B:
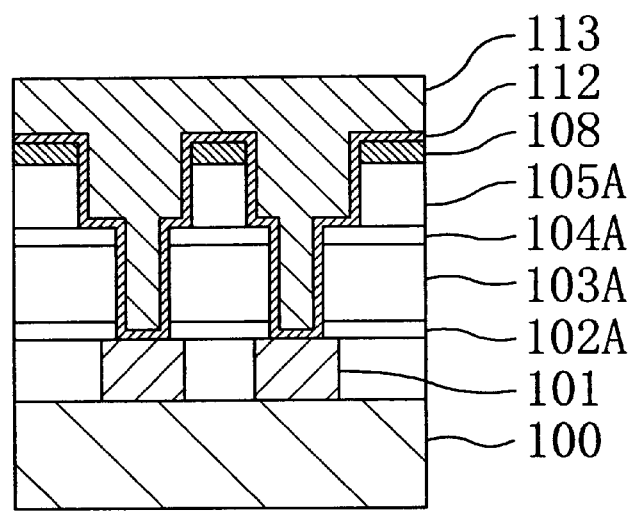

Then, as shown in FIG. 3(b), an adhesion layer 112, made of titanium nitride, is deposited to be 50 nm thick, for example, on the wall faces of the contact holes 110 and the wiring grooves 111. Thereafter, a metal film 113 is deposited over the entire surface of the substrate to completely fill in the contact holes 110 and the wiring grooves 111. In this embodiment, the metal film 113 may be made of any arbitrary metal. For example, copper, aluminum, gold, silver, nickel, cobalt, tungsten, or an alloy thereof may be used. Also, the metal film 113 may be deposited by any arbitrary technique. For instance, plating, CVD or sputtering may be employed.

Figure 3C:
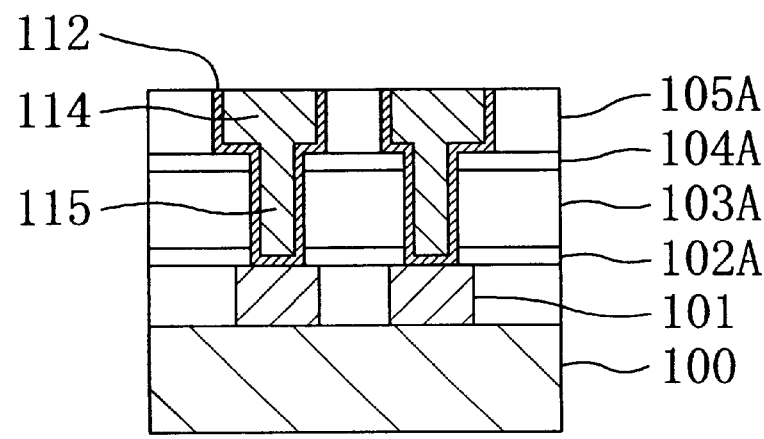

Finally, as shown in FIG. 3(c), respective portions of the adhesion layer 112, the metal film 113 and the mask pattern 108, which are deposited on the patterned second organic film 105A, are removed by a CMP technique, for example. As a result, second metal interconnects 114 and contacts 115, connecting the first and second metal interconnects 101 and 114, are formed out of the metal film 113.

It should be noted that a multilevel interconnection structure may be formed by forming respective films, interconnects and contacts on the second metal interconnects 114 through the same process steps as those described above.

In the first embodiment, the organic-containing silicon dioxide film 104 is formed by a CVD process using a reactive gas mainly composed of phenyltrimethoxy silane. Accordingly, the film 104 has a structure in which a phenyl group (i.e., an exemplary organic group), bonded to a silicon atom, is introduced into silicon dioxide. Thus, the film 104 can be processed as well as a conventional CVD oxide film, and the relative dielectric constant of the film 104 is as low as that of the conventional CVD oxide film. In addition, the film 104 can adhere strongly to organic film, oxide film and metal film.

After the mask pattern 108 has been formed out of the titanium nitride film 106, the second resist pattern 109 is formed without removing the first resist pattern 107, and the first and second resist patterns 107 and 109 are removed while the second organic film 105 is dry-etched. Thus, it is no longer necessary to ash and remove the first and second resist patterns 107 and 109 with oxygen plasma. That is to say, it is possible to prevent the second organic film 105 from being damaged during the step of ashing and removing a resist pattern. Accordingly, although the second organic film 105 with a low relative dielectric constant is used as an interlevel insulating film, an ordinary resist application process is applicable to this embodiment.

Moreover, the wiring grooves 111 are formed by dry-etching the patterned second organic film 105A using the mask pattern 108 as a mask and using the patterned organic-containing silicon dioxide film 104A as an etch stopper. Accordingly, the depth of the wiring grooves 111 matches with the thickness of the second organic film 105. That is to say, the depth of the wiring grooves 111 can be defined by self-alignment.

Hereinafter, problems caused by the misalignment of the second resist pattern 109 with the first resist pattern 107 and the measured taken to solve the problems will be described.

First, it will be described with reference to FIGS. 4(a) through 4(c), FIGS. 5(a) through 5(c) and FIGS. 6(a) through 6(c) what problems are caused if the second resist pattern 109 has misaligned.

Figure 4A:
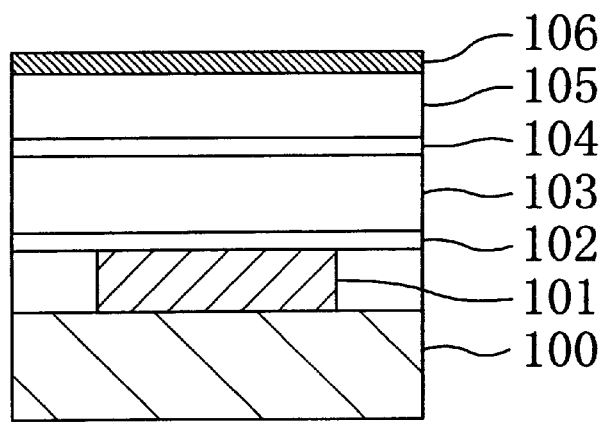
FIGS. 4(a) through 4(c) are cross-sectional views illustrating problems caused by the misalignment of the second resist pattern during the process of forming the interconnection structure of the first embodiment.

As in the first embodiment, a silicon nitride film 102 is first formed to be 50 nm thick, for example, over first metal interconnects 101 formed on a semiconductor substrate 100 as shown in FIG. 4(a). Thereafter, a first organic film 103, mainly composed of an organic component, is formed to be 1 $\mu$m thick, for example, on the silicon nitride film 102.

Next, an organic-containing silicon dioxide film 104, containing an organic component in silicon dioxide, is formed to be 50 nm thick, for example, on the first organic film 103. Then, a second organic film 105, mainly composed of an organic component, is formed to be 400 nm thick, for example, on the organic-containing silicon dioxide film 104. And a titanium nitride film 106 is formed to be 50 nm thick, for example, on the second organic film 105.

Figure 4B:
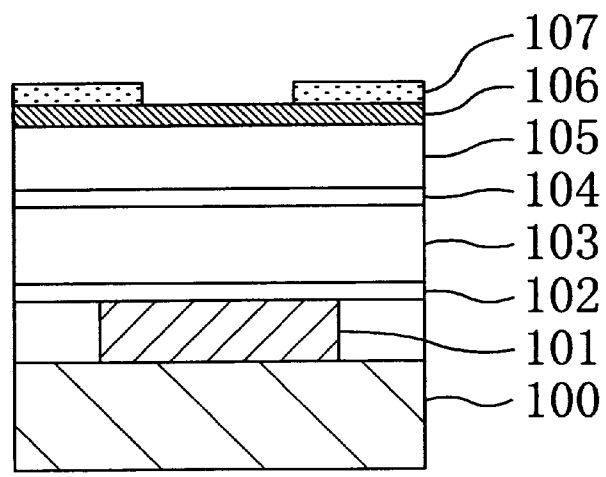
Figure 4C:
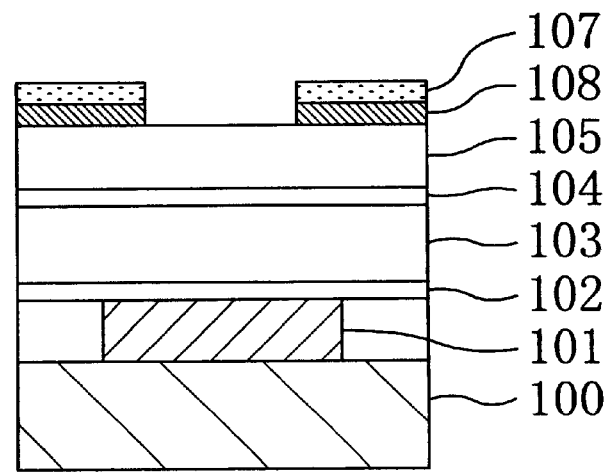
Figure 5A:
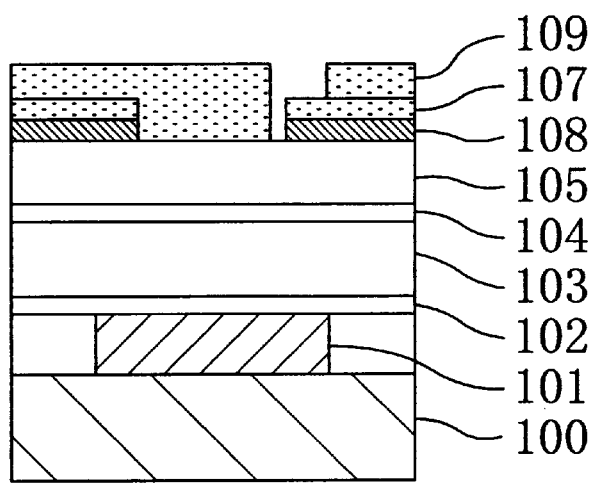
FIGS. 5(a) through 5(c) are cross-sectional views illustrating the problems caused by the misalignment of the second resist pattern during the process of forming the interconnection structure of the first embodiment.
Figure 5B:
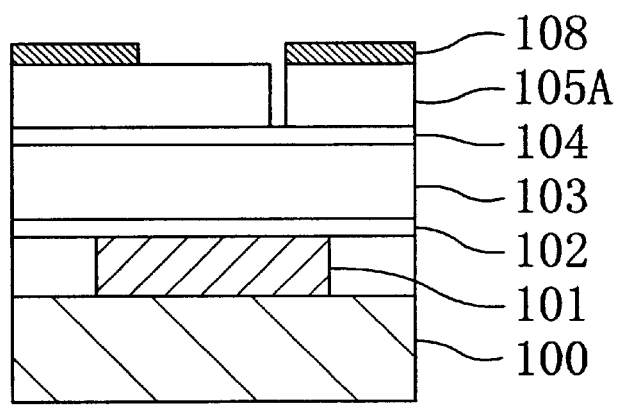
Figure 5C:
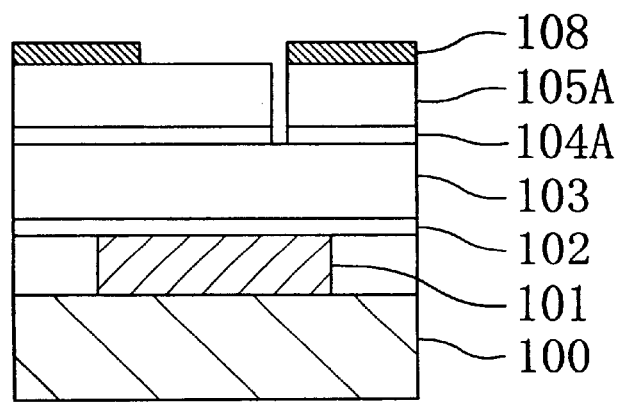
Figure 6A:
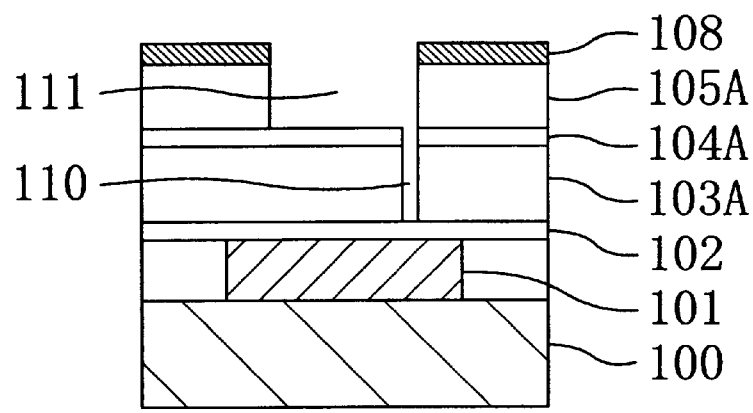
FIGS. 6(a) through 6(c) are cross-sectional views illustrating the problems caused by the misalignment of the second resist pattern during the process of forming the interconnection structure of the first embodiment.
Figure 6B:
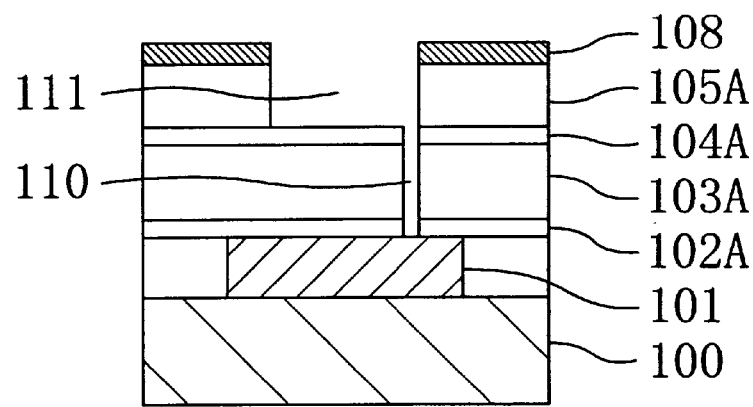
Figure 6C:
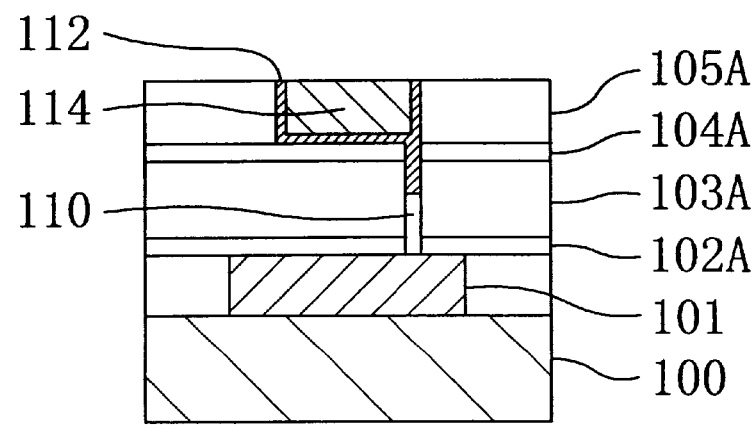

Next, as shown in FIG. 4(b), a first resist pattern 107, having openings for forming wiring grooves, is formed on the titanium nitride film 106. Thereafter, the titanium nitride film 106 is dry-etched using the first resist pattern 107 as a mask, thereby forming a mask pattern 108 out of the titanium nitride film 106 as shown in FIG. 4(*c*).

Subsequently, a second resist pattern 109, having openings for forming contact holes, is formed on the second organic film 105 without removing the first resist pattern 107. As can be seen if FIGS. 5(*a*) and 1(*c*) are compared with each other, the second resist pattern 109 has misaligned with the first resist pattern 107 in this case.

Then, the second organic film 105 is dry-etched, thereby forming a patterned second organic film 105A having the openings for forming contact holes as shown in FIG. 5(*a*). As in the first embodiment, since the second organic film 105 and the first and second resist patterns 107 and 109 are all mainly composed of organic components, the first and second resist patterns 107 and 109 are removed simultaneously with the dry-etching of the second organic film 105. In this case, since the second resist pattern 109 has misaligned with the first resist pattern 107, the diameter of the openings for forming contact holes, which are provided in the second organic film 105A, is smaller than desired.

Then, the organic-containing silicon dioxide film 104 is dry-etched using the patterned second organic film 105A as a mask, thereby forming a patterned organic-containing silicon dioxide film 104A having the openings for forming contact holes as shown in FIG. 5(*c*).

Next, the patterned second organic film 105A is dry-etched using the mask pattern 108 as a mask, thereby forming the wiring grooves 111 in the patterned second organic film 105A as shown in FIG. 6(*a*). At the same time, the first organic film 103 is also dry-etched using the patterned organic-containing silicon dioxide film 104A as a mask, thereby forming a patterned first organic film 103A having the contact holes 110 as shown in FIG. 6(*a*). Subsequently, the silicon nitride film 102 is dry-etched using the patterned organic-containing silicon dioxide film 104A as a mask, thereby forming a patterned silicon nitride film 102A and exposing the first metal interconnects 101 within the contact holes 110 as shown in FIG. 6(*b*).

Then, an adhesion layer 112, made of titanium nitride, is deposited to be 50 nm thick, for example, on the wall faces of the contact holes 110 and the wiring grooves 111. Thereafter, a metal film is deposited over the entire surface of the substrate and respective portions of the adhesion layer 112, the metal film and the mask pattern 108, which are deposited on the patterned second organic film l05A, are removed by a CMP technique, for example. As a result, second metal interconnects 114 are certainly formed. However, since the diameter of the contact holes 110 is smaller than desired, the contact holes 110 cannot be completely filled in with the metal film, and the first and second metal interconnects 101 and 112 cannot be connected to each other, resulting in a contact failure.

Next, it will be described with reference to FIGS. 7(*a*) through 7(*c*) and FIGS. 8(*a*) through 8(*c*) what measures should be taken to solve the problems caused by the misalignment of the second resist pattern 109.

First, a second resist pattern 109, having openings for forming contact holes, is formed through the same process steps as those described with reference to FIGS. 4(*a*) through 4(*c*) and FIG. 5(*a*). In this case, the second resist pattern 109 has also misaligned with the first resist pattern 107 (see FIG. 5(*a*)).

Figure 7A:
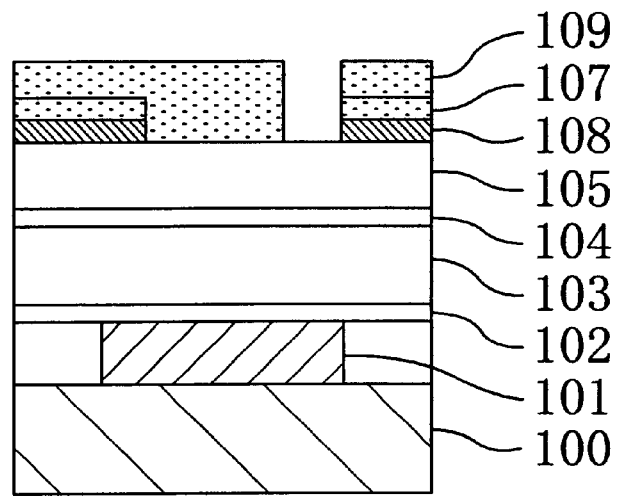
FIGS. 7(a) through 7(c) are cross-sectional views illustrating measures to solve the problems caused by the misalignment of the second resist pattern during the process of forming the interconnection structure of the first embodiment.
Figure 7B:
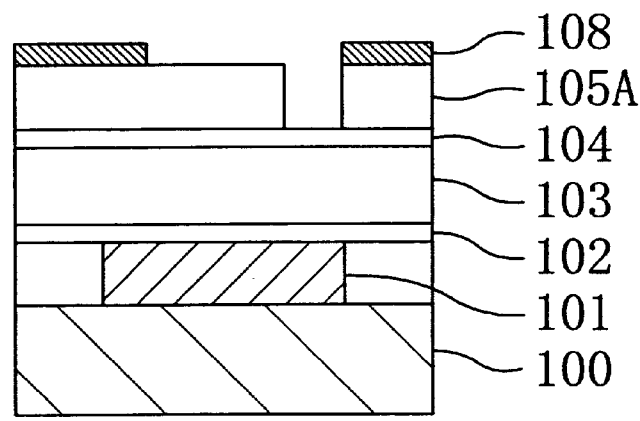
Figure 7C:
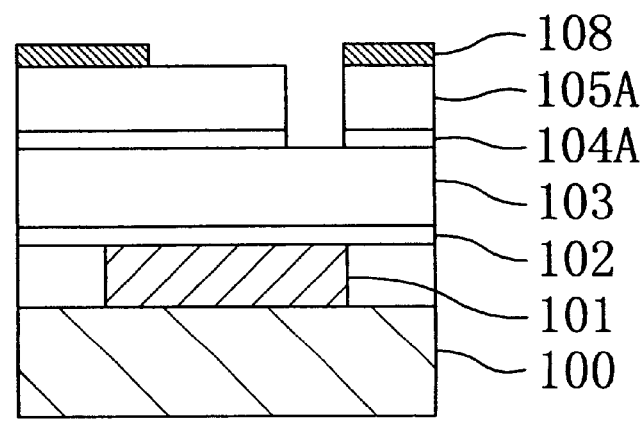

Thus, as shown in FIG. 7(*a*), the first resist pattern 107 and the mask pattern 108 are dry-etched using the second resist pattern 109 as a mask. In this manner, portions of the first resist pattern 107, not overlapping with the second resist pattern 109, are removed and each opening of the mask pattern 108 is expanded to be equal to or larger than each opening for forming wiring grooves or each opening for forming contact holes. As a result, the pattern for the openings of the second resist pattern for forming contact holes 109 can be transferred to the first resist pattern 107 and the mask pattern 108.

Then, the second organic film 105 is dry-etched, thereby forming a patterned second organic film 105A having the openings for forming contact holes as shown in FIG. 7(*b*). In this case, since the second organic film 105 and the first and second resist patterns 107 and 109 are all mainly composed of organic components, the first and second resist patterns 107 and 109 are removed simultaneously with the dry-etching of the second organic film 105.

Then, the organic-containing silicon dioxide film 104 is dry-etched using the patterned second organic film 105A as a mask, thereby forming a patterned organic-containing silicon dioxide film 104A having the openings for forming contact holes as shown in FIG. 7(*c*).

As described above, the second resist pattern 109 has misaligned with the first resist pattern 107. However, in this case, the pattern for the openings of the second resist pattern for forming contact holes 109 has been successfully transferred to the first resist pattern 107 and the mask pattern 108. Thus, the diameter of the openings for forming contact holes, which have been formed in the patterned second organic film 105A and the patterned organic-containing silicon dioxide film 104A, is a predetermined size.

Figure 8A:
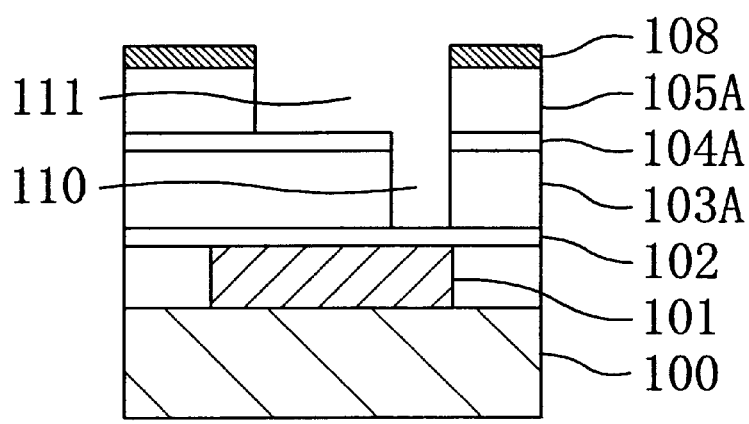
FIGS. 8(a) through 8(c) are cross-sectional views illustrating the measures to solve the problems caused by the misalignment of the second resist pattern during the process of forming the interconnection structure of the first embodiment.
Figure 8B:
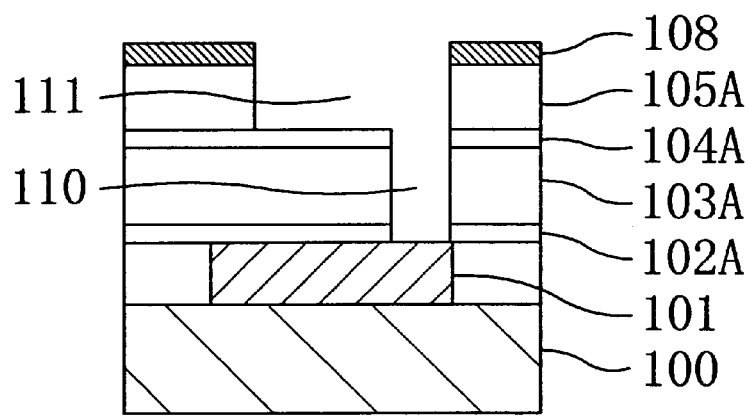
Figure 8C:
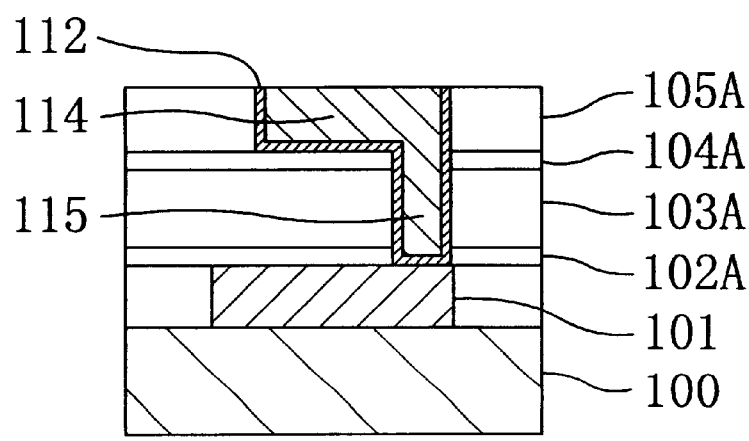

Next, the patterned second organic film 105A is dry-etched using the mask pattern 108 as a mask, thereby forming the wiring grooves 111 in the patterned second organic film 105A as shown in FIG. 8(*a*). At the same time, the first organic film 103 is also dry-etched using the patterned organic-containing silicon dioxide film 104A as a mask, thereby forming a patterned first organic film 103A having the contact holes 110 as shown in FIG. 8(*a*). Subsequently, the silicon nitride film 102 is dry-etched using the patterned organic-containing silicon dioxide film 104A as a mask, thereby forming a patterned silicon nitride film 102A and exposing the first metal interconnects 101 within the contact holes 110 as shown in FIG. 8(*b*).

Then, an adhesion layer 112, made of titanium nitride, is deposited to be 50 nm thick, for example, on the wall faces of the contact holes 110 and the wiring grooves 111. Thereafter, a metal film is deposited over the entire surface of the substrate and respective portions of the adhesion layer 112, the metal film and the mask pattern 108, which are deposited on the patterned second organic film 105A, are removed by a CMP technique, for example. As a result, second metal interconnects 114 and contacts 115 are formed out of the titanium nitride film 112 and the metal film as shown in FIG. 8(*c*).

EMBODIMENT 2

Next, an exemplary method for forming an interconnection structure according to the second embodiment of the present invention will be described with reference to FIGS. 9(*a*) through 9(*c*), FIGS. 10(*a*) through 10(*c*) and FIGS. 11(*a*) through 11(*c*).

Figure 9A:
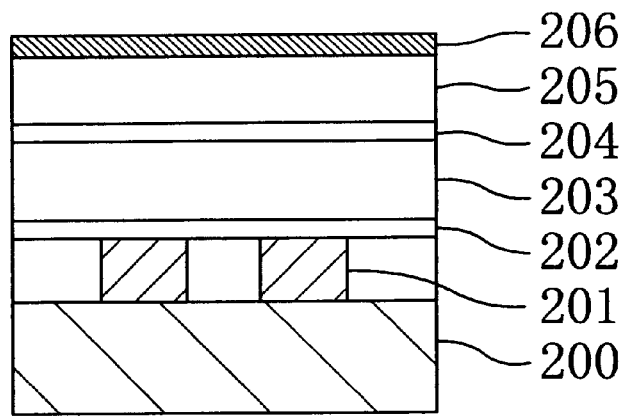
FIGS. 9(a) through 9(c) are cross-sectional views illustrating respective process steps for forming an interconnection structure according to the second embodiment of the present invention.
Figure 9B:
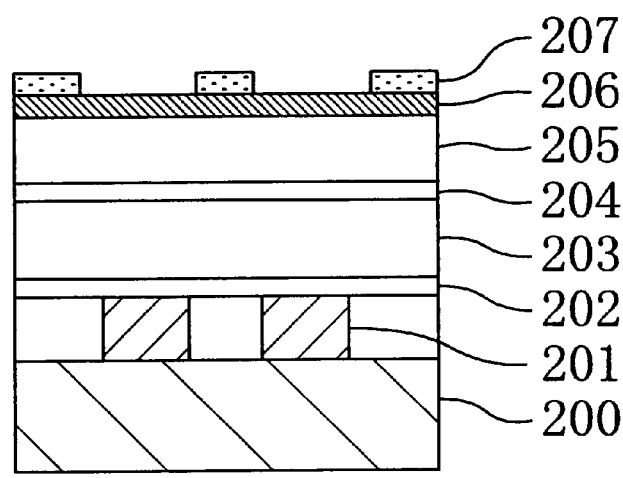
Figure 9C:
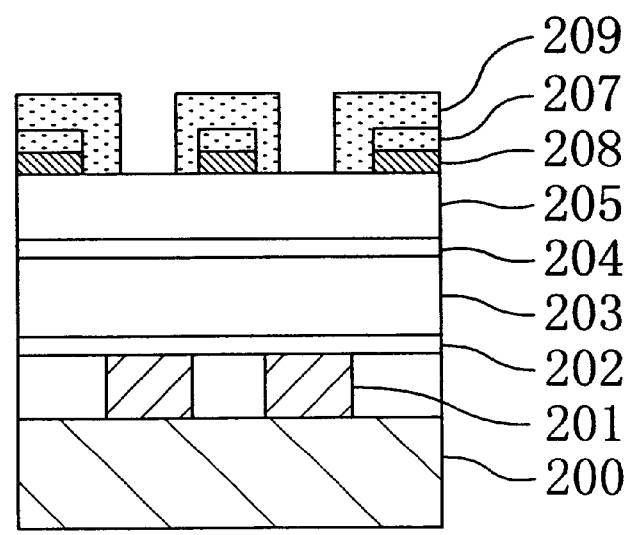

First, as shown in FIG. 9(*a*), a silicon nitride film 202 is formed to be 50 nm thick, for example, over first metal interconnects 201 formed on a semiconductor substrate 200. Thereafter, a first organic film 203 (first insulating film), mainly composed of an organic component, is formed to be 1 μm thick, for example, on the silicon nitride film 202. Next, an organic-containing silicon dioxide film 204 (second insulating film), containing an organic component in silicon dioxide, is formed to be 50 nm thick, for example, on the first organic film 203. Then, a second organic film 205 (third insulating film), mainly composed of an organic component, is formed to be 400 nm thick, for example, on the organic-containing silicon dioxide film 204. And a titanium nitride film 206 is formed to be 50 nm thick, for example, on the second organic film 205.

The first and second organic films 203 and 205 may be deposited by any arbitrary technique. For example, these films 203 and 205 may be deposited by a plasma CVD process using a reactive gas mainly composed of perfluorodecalin. Also, hydrocarbon films or fluorine-containing hydrocarbon films, formed by plasma CVD, coating or thermal CVD, may be used as the first and second organic films 203 and 205.

Similarly, the organic-containing silicon dioxide film 204 may also be deposited by any arbitrary technique. For instance, the film 204 may be deposited by a CVD process using a reactive gas mainly composed of phenyltrimethoxy silane.

It should be noted that a thin film showing high etch selectivity with respect to the first and second organic films 203 and 205 and the organic-containing silicon dioxide film 204, i.e., a film etched at a sufficiently low rate (e.g., silicon nitride film), may be used instead of the titanium nitride film 206.

Next, as shown in FIG. 9(*b*), a first resist pattern 207, having openings for forming wiring grooves, is formed by lithography on the titanium nitride film 206. Thereafter, the titanium nitride film 206 is dry-etched using the first resist pattern 207 as a mask, thereby forming a mask pattern 208 out of the titanium nitride film 206 as shown in FIG. 9(*c*).

Subsequently, a second resist pattern 209, having openings for forming contact holes, is formed by lithography on the second organic film 205 without removing the first resist pattern 207. Then, the second organic film 205 is dry-etched, thereby forming a patterned second organic film 205A having the openings for forming contact holes as shown in FIG. 10(*a*). In this case, since the second organic film 205 and the first and second resist patterns 207 and 209 are all mainly composed of organic components, the second organic film 205 is etched at a rate substantially equal to that of the first and second resist patterns 207 and 209. Accordingly, when the second organic film 205 is dry-etched, the first and second resist patterns 207 and 209 are also removed simultaneously.

If the second resist pattern 209 may have been misaligned with the first resist pattern 207, then the first resist pattern 207 and the mask pattern 208 should be dry-etched using the second resist pattern 209 as a mask. In this manner, parts of the first resist pattern 207, not overlapping with the second resist pattern 209, are removed and the openings of the mask pattern 208 are expanded to be equal to or larger than the openings for forming wiring grooves and contact holes as described in the first embodiment.

Figure 10A:
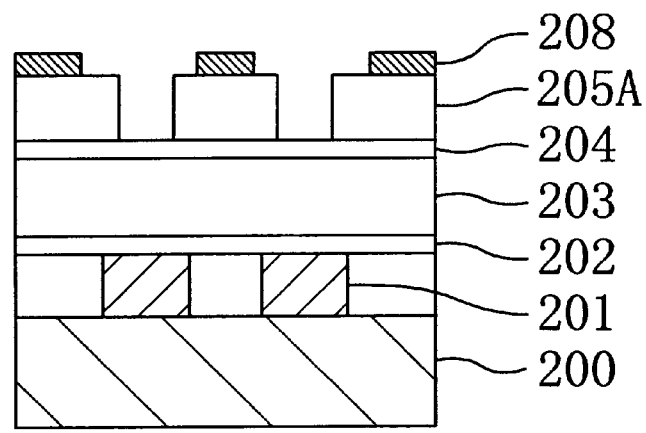
FIGS. 10(a) through 10(c) are cross-sectional views illustrating respective process steps for forming the interconnection structure of the second embodiment.
Figure 10B:
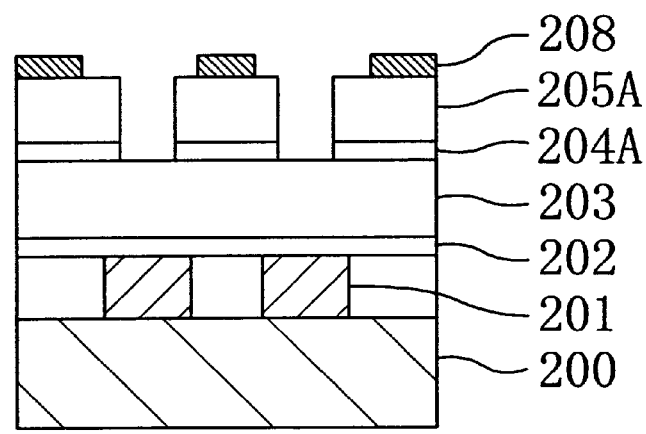
Figure 10C:
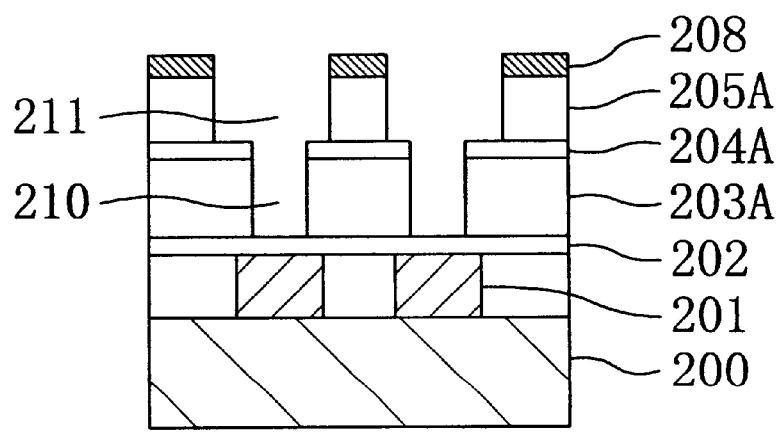

Then, the organic-containing silicon dioxide film 204 is dry-etched using the patterned second organic film 205A as a mask, thereby forming a patterned organic-containing silicon dioxide film 204A having the openings for forming contact holes as shown in FIG. 10(*b*). Next, the patterned second organic film 205A is dry-etched using the mask pattern 208 as a mask, thereby forming the wiring grooves 211 in the patterned second organic film 205A as shown in FIG. 10(*c*). At the same time, the first organic film 203 is also dry-etched using the patterned organic-containing silicon dioxide film 204A as a mask, thereby forming a patterned first organic film 203A having the contact holes 210 as also shown in FIG. 10(*c*).

Figure 11A:
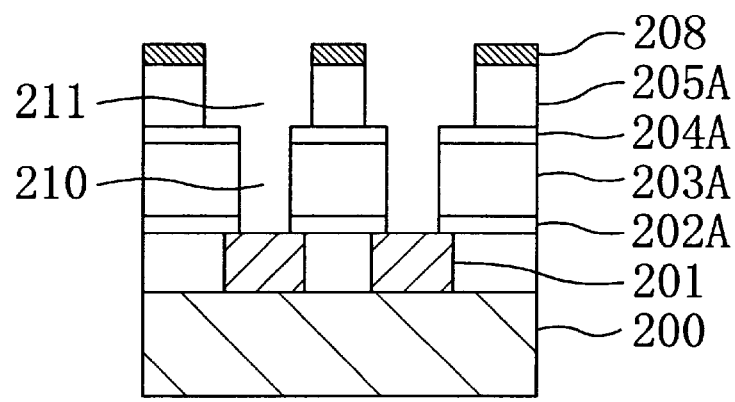
FIGS. 11(a) through 11(c) are cross-sectional views illustrating respective process steps for forming the interconnection structure of the second embodiment.
Figure 11B:
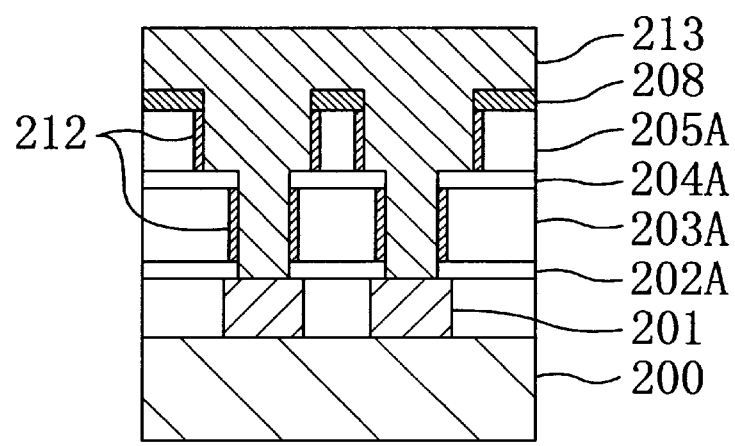
Figure 11C:
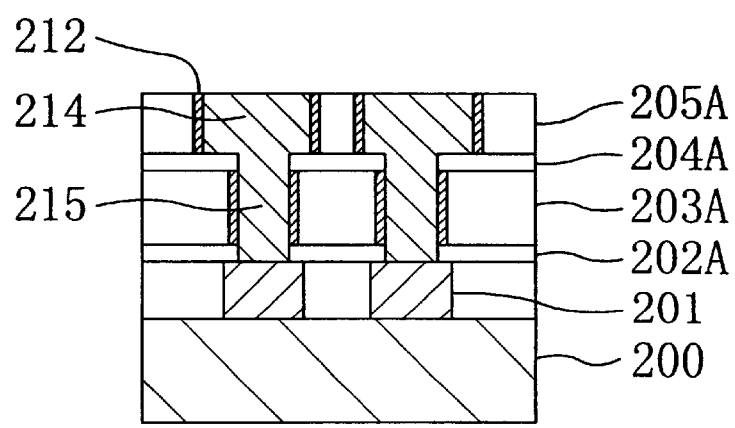

Subsequently, the silicon nitride film 202 is dry-etched using the patterned organic-containing silicon dioxide film 204A as a mask, thereby forming a patterned silicon nitride film 202A and exposing the first metal interconnects 201 within the contact holes 210 as shown in FIG. 11(*a*).

Then, the patterned first and second organic films 203A and 205A are subjected to plasma processing using ammonium gas. As a result, as shown in FIG. 11(*b*), an adhesion layer 212, including amino and amide groups, is deposited on the wall faces of the patterned first organic film 203A exposed inside the contact holes 210 and on the wall faces of the patterned second organic film 205A exposed inside the wiring grooves 211. Thereafter, a metal film 213 is deposited over the entire surface of the substrate to completely fill in the contact holes 210 and the wiring grooves 211. In this embodiment, the metal film 213 may be made of any arbitrary metal. For example, copper, aluminum, gold, silver, nickel, cobalt, tungsten, or an alloy thereof may be used. Also, the metal film 213 may be deposited by any arbitrary technique. For instance, plating, CVD or sputtering may be employed.

Finally, as shown in FIG. 11(*c*), respective portions of the metal film 213 and the mask pattern 208, which are deposited on the patterned second organic film 205A, are removed by a CMP technique, for example. As a result, second metal interconnects 214 and contacts 215 are formed out of the metal film 213.

It should be noted that a multilevel interconnection structure may be formed by forming respective films, interconnects and contacts on the second metal interconnects 214 through the same process steps as those described above.

EMBODIMENT 3

Next, an exemplary method for forming an interconnection structure according to the third embodiment of the present invention will be described with reference to FIGS. 12(*a*) through 12(*c*), FIGS. 13(*a*) through 13(*c*) and FIGS. 14(*a*) through 14(*c*).

Figure 12A:
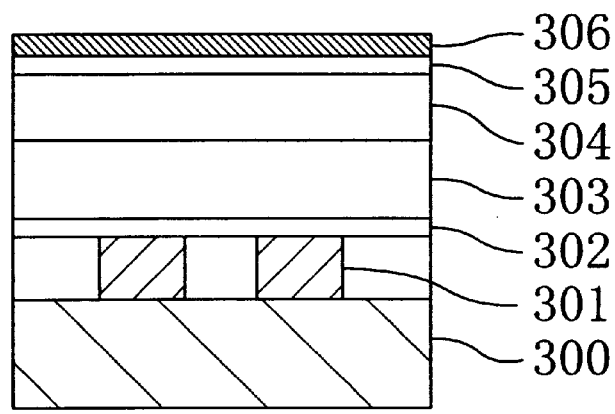
FIGS. 12(a) through 12(c) are cross-sectional views illustrating respective process steps for forming an interconnection structure according to the third embodiment of the present invention.

First, as shown in FIG. 12(*a*), a silicon nitride film 302 is formed over first metal interconnects 301 formed on a semiconductor substrate 300. The silicon nitride film 302 is formed to be 50 nm thick, for example, and to protect the first metal interconnects 301 during a subsequent etching process step. Thereafter, a first organic-containing silicon dioxide film 303 (first insulating film), containing an organic component in silicon dioxide, is formed to be 1 μm thick, for example, on the silicon nitride film 302. Next, a low-dielectric-constant SOG film 304 (second insulating film), having a siloxane skeleton, is deposited to be 400 nm thick, for example, on the first organic-containing silicon dioxide film 303. Then, a second organic-containing silicon dioxide film 305 (third insulating film), containing an organic component in silicon dioxide, is formed to be 50 nm thick, for example, on the low-dielectric-constant SOG film 304. And a titanium nitride film 306 is formed to be 50 nm thick, for example, on the second organic-containing silicon dioxide film 305.

The first and second organic-containing silicon dioxide films 303 and 305 may be deposited by any arbitrary technique. For example, these films 303 and 305 may be deposited by a CVD process using a reactive gas mainly composed of phenyltrimethoxy silane. Also, an HSQ film may be used as the low-dielectric-constant SOG film 304 with a siloxane skeleton.

It should be noted that a thin film showing high etch selectivity with respect to the first and second organic-containing silicon dioxide films 303 and 305 and the low-dielectric-constant SOG film 304, i.e., a film etched at a sufficiently low rate (e.g., silicon nitride film), may be used instead of the titanium nitride film 306.

Figure 12B:
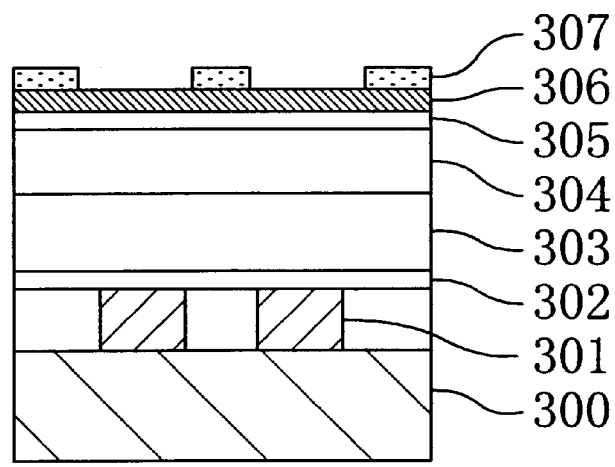
Figure 12C:
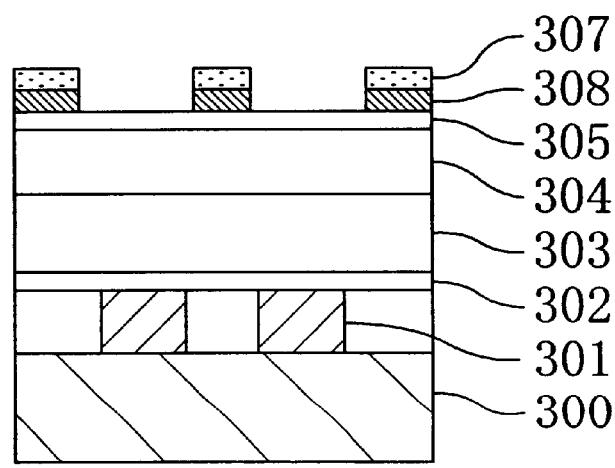

Next, as shown in FIG. 12(b), a first resist pattern 307, having openings for forming wiring grooves, is formed by lithography on the titanium nitride film 306. Thereafter, the titanium nitride film 306 is dry-etched using the first resist pattern 307 as a mask, thereby forming a mask pattern 308 out of the titanium nitride film 306 as shown in FIG. 12(c).

Figure 13A:
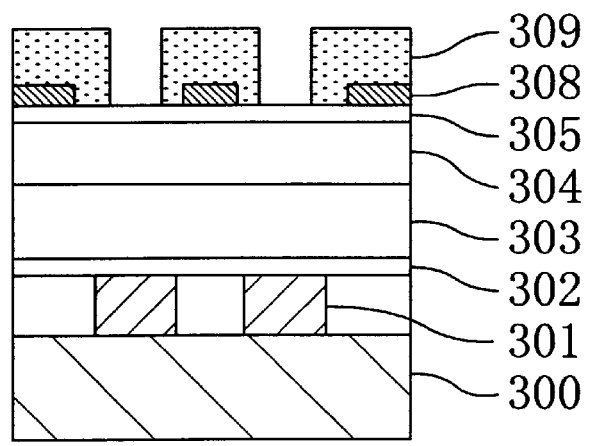
FIGS. 13(a) through 13(c) are cross-sectional views illustrating respective process steps for forming the interconnection structure of the third embodiment.
Figure 13B:
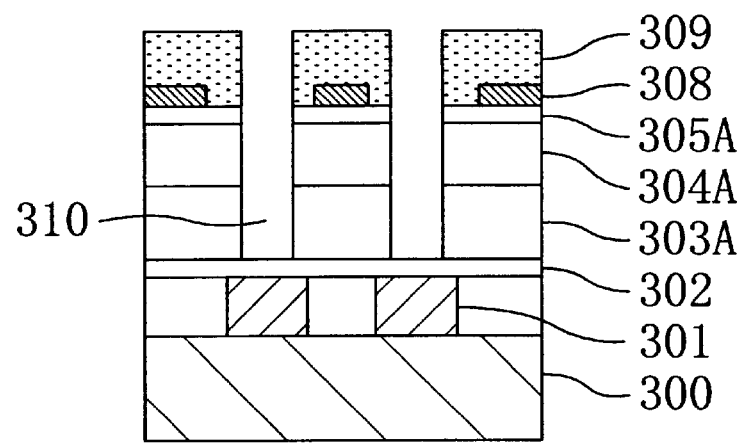

Subsequently, as shown in FIG. 13(a), the first resist pattern 307 is removed and then a second resist pattern 309, having openings for forming contact holes, is formed on the second organic-containing silicon dioxide film 305. Then, the second organic-containing silicon dioxide film 305, the low-dielectric-constant SOG film 304 and the first organic-containing silicon dioxide film 303 are sequentially dry-etched using the second resist pattern 309 as a mask. As a result, a patterned second organic-containing silicon dioxide film 305A, a patterned low-dielectric-constant SOG film 304A and a patterned first organic-containing silicon dioxide film 303A having contact holes 310 are formed as shown in FIG. 13(b).

Figure 13C:
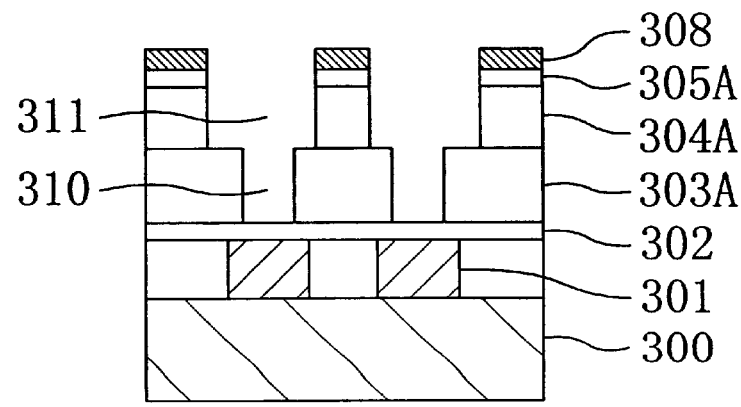

Next, as shown in FIG. 13(c), the second resist pattern 309 is removed and the patterned second organic-containing silicon dioxide film 305A is dry-etched using the mask pattern 308 as a mask, thereby forming openings for forming wiring grooves in the patterned second organic-containing silicon dioxide film 305A. Thereafter, the patterned low-dielectric-constant SOG film 304A is dry-etched using the mask pattern 308 and the patterned second organic-containing silicon dioxide film 305A having the openings for wiring grooves as a mask, thereby forming the wiring grooves 311. In forming the wiring grooves 311, by selecting such etching conditions that the first organic-containing silicon dioxide film 303A is etched at a rate sufficiently lower than that of the low-dielectric-constant SOG film 304A, sufficient selectivity can be secured for the patterned first organic-containing silicon dioxide film 303A. Accordingly, the depth of the wiring grooves 311 can be determined univalently at the sum of the thicknesses of the second organic-containing silicon dioxide film 305 and the low-dielectric-constant SOG film 304.

If the second resist pattern 309 may have been misaligned with the first resist pattern 307, the mask pattern 308 should be dry-etched using the second resist pattern 309 as a mask before the second organic-containing silicon dioxide film 305 is dry-etched using the second resist pattern 309 as a mask. That is to say, if the mask pattern 308 is partially exposed inside the openings of the second resist pattern 309 for forming contact holes because of the misalignment of the second resist pattern 309 with the first resist pattern 307, then the mask pattern 308 is dry-etched using the second resist pattern 309 as a mask. In this manner, the openings of the mask pattern 308 are expanded to include the openings for forming wiring grooves and contact holes.

Figure 14A:
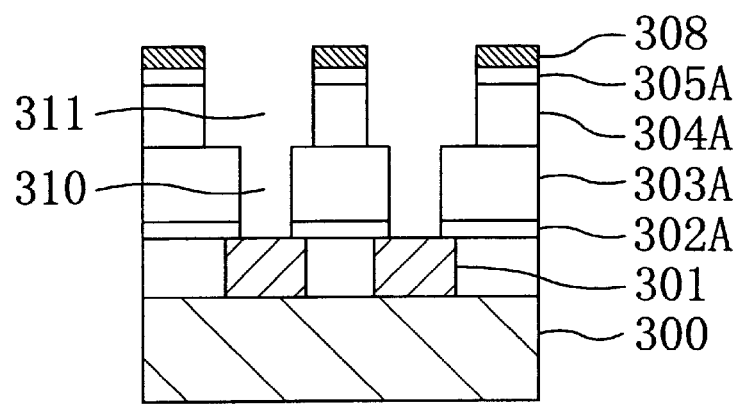
FIGS. 14(a) through 14(c) are cross-sectional views illustrating respective process steps for forming the interconnection structure of the third embodiment.

Subsequently, the silicon nitride film 302 is dry-etched using the patterned first organic-containing silicon dioxide film 303A as a mask, thereby forming a patterned silicon nitride film 302A and exposing the first metal interconnects 301 within the contact holes 310 as shown in FIG. 14(a).

Figure 14B:
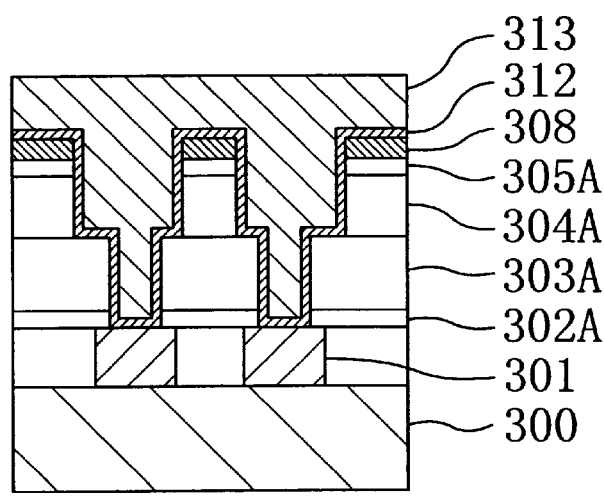

Then, as shown in FIG. 14(b), an adhesion layer 312, made of titanium nitride, is deposited to be 50 nm thick, for example, on the wall faces of the contact holes 310 and the wiring grooves 311. Thereafter, a metal film 313 is deposited over the entire surface of the substrate to completely fill in the contact holes 310 and the wiring grooves 311. In this embodiment, the metal film 313 may be made of any arbitrary metal. For example, copper, aluminum, gold, silver, nickel, cobalt, tungsten, or an alloy thereof may be used. Also, the metal film 313 may be deposited by any arbitrary technique. For instance, plating, CVD or sputtering may be employed.

Figure 14C:
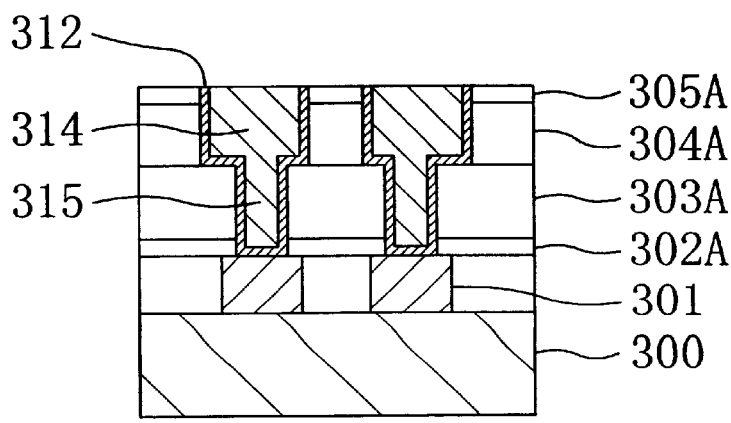

Finally, as shown in FIG. 14(c), respective portions of the adhesion layer 312, the metal film 313 and the mask pattern 308, which are deposited on the patterned second organic-containing silicon dioxide film 305A, are removed by a CMP technique, for example. As a result, second metal interconnects 314 and contacts 315, connecting the first and second metal interconnects 301 and 314, are formed out of the metal film 313.

It should be noted that a multilevel interconnection structure may be formed by forming respective films, interconnects and contacts on the second metal interconnects 314 through the same process steps as those described above.

In the third embodiment, while the first resist pattern 307 is ashed and removed with oxygen plasma, the low-dielectric-constant SOG film 304 is not exposed to the oxygen plasma, because the second organic-containing silicon dioxide film 305 exists on the low-dielectric-constant SOG film 304.

Also, in this embodiment, after the second organic-containing silicon dioxide film 305, the low-dielectric-constant SOG film 304 and the first organic-containing silicon dioxide film 303 have been sequentially dry-etched using the second resist pattern 309 as a mask, the second resist pattern 309 is ashed and removed with oxygen plasma. Accordingly, the regions of the patterned low-dielectric-constant SOG film 304A, which are exposed inside the openings for forming contact holes, are exposed to oxygen plasma and damaged. However, the damaged layer, formed in the patterned low-dielectric-constant SOG film 304A, can be removed when the wiring grooves 311 are formed in the patterned low-dielectric-constant SOG film 304A, and does not have harmful effects on subsequent process steps.

Accordingly, the low-dielectric-constant SOG film 304 may be made of a material degradable with oxygen plasma. For example, in general, if an HSQ film is exposed to oxygen plasma, the Si—H bonds thereof are oxidized and the content of water and the relative dielectric constant thereof both increase to deteriorate the reliability and performance of the device. However, according to the third embodiment, the patterned low-dielectric-constant SOG film 304A, in which the wiring grooves 311 have already been formed, is not affected by oxygen plasma. Thus, even if an HSQ film is used as an interlevel insulating film, the deterioration in reliability and performance of the device can be avoided.

MODIFIED EXAMPLE OF EMBODIMENT 3

Next, an exemplary method for forming an interconnection structure according to a modified example of the third embodiment of the present invention will be described with reference to FIGS. 15(a) through 15(c), FIGS. 16(a) through 16(c) and FIGS. 17(a) through 17(c).

Figure 15A:
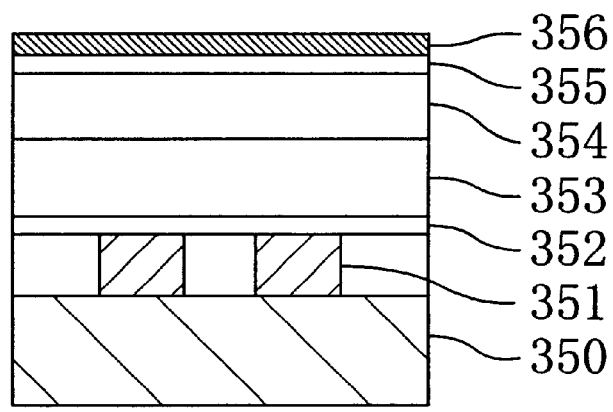
FIGS. 15(a) through 15(c) are cross-sectional views illustrating respective process steps for forming an interconnection structure according to a modified example of the third embodiment.

First, as shown in FIG. 15(a), a silicon nitride film 352 is formed over first metal interconnects 351 formed on a semiconductor substrate 350. The silicon nitride film 352 is formed to be 50 nm thick, for example, and to protect the first metal interconnects 351 during a subsequent etching process step. Thereafter, a first silicon dioxide film 353 (first insulating film) is formed to be 1 μm thick, for example, on the silicon nitride film 352. Next, an organic film 354 (second insulating film) is deposited to be 400 nm thick, for example, on the first silicon dioxide film 353. Then, a second silicon dioxide film 355 (third insulating film) is formed to be 50 nm thick, for example, on the organic film 354. And a titanium nitride film 356 is formed to be 50 nm thick, for example, on the second silicon dioxide film 355.

The first and second silicon dioxide films 353 and 355 may be deposited by any arbitrary technique. For example, these films 353 and 355 may be deposited by a CVD process using a reactive gas mainly composed of phenyltrimethoxy silane.

It should be noted that a thin film showing high etch selectivity with respect to the first and second silicon dioxide films 353 and 355 and the organic film 354, i.e., a film etched at a sufficiently low rate (e.g., silicon nitride film), may be used instead of the titanium nitride film 356.

Figure 15B:
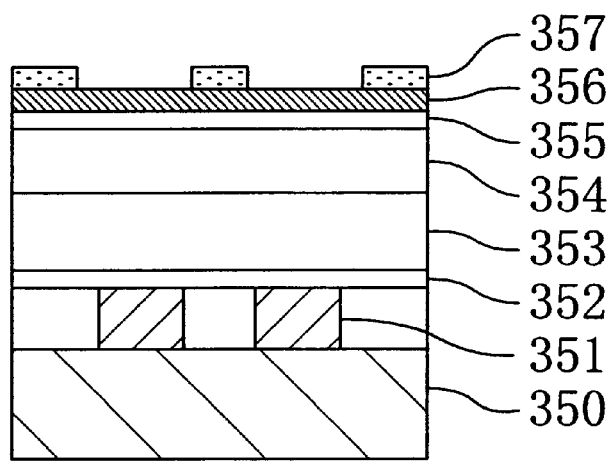
Figure 15C:
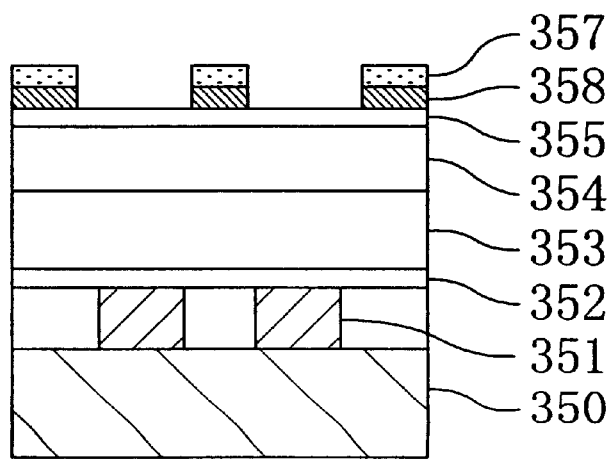

Next, as shown in FIG. 15(b), a first resist pattern 357, having openings for forming wiring grooves, is formed by lithography on the titanium nitride film 356. Thereafter, the titanium nitride film 356 is dry-etched using the first resist pattern 357 as a mask, thereby forming a mask pattern 358 out of the titanium nitride film 356 as shown in FIG. 15(c).

Figure 16A:
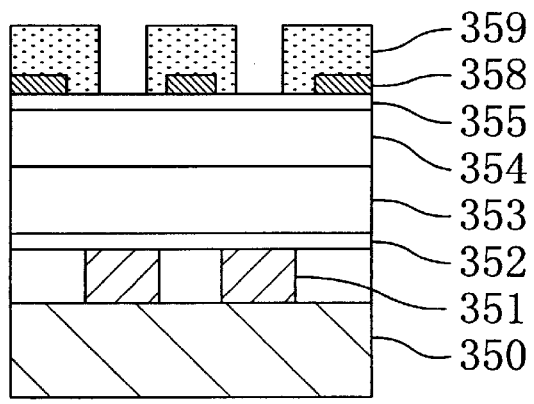
FIGS. 16(*a*) through 16(*d*) are cross-sectional views illustrating respective process steps for forming the interconnection structure of the modified example of the third embodiment.
Figure 16B:
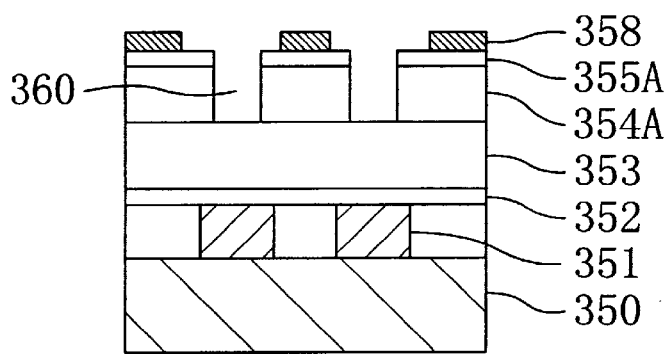

Subsequently, as shown in FIG. 16(a), the first resist pattern 357 is removed and then a second resist pattern 359, having openings for forming contact holes, is formed on the second silicon dioxide film 355. Then, the second silicon dioxide film 355 and the organic film 354 are sequentially dry-etched using the second resist pattern 359 as a mask, thereby forming a patterned second silicon dioxide film 355A and a patterned organic film 354A having openings 360 for forming contact holes as shown in FIG. 16(b). In this case, the second resist pattern 359 is removed during the step of etching the organic film 354.

Figure 16C:
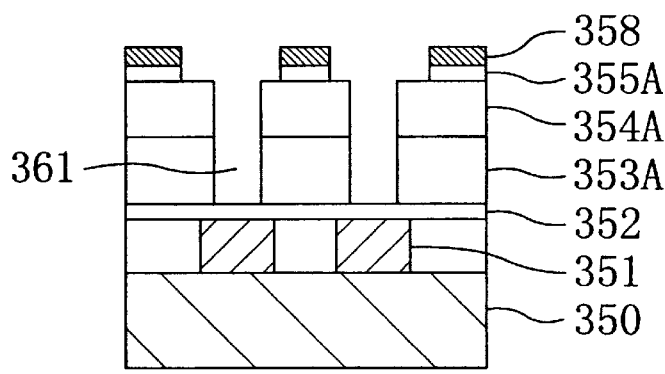

Next, as shown in FIG. 16(c), the first silicon dioxide film 353 is dry-etched using the patterned second silicon dioxide film 355A and the patterned organic film 354A as a mask, thereby forming a patterned first silicon dioxide film 353A having contact holes 361. In this etching process step, the mask pattern 358 is transferred to the patterned second silicon dioxide film 355A. Accordingly, openings for forming wiring grooves are formed in the patterned second silicon dioxide film 355A.

Figure 16D:
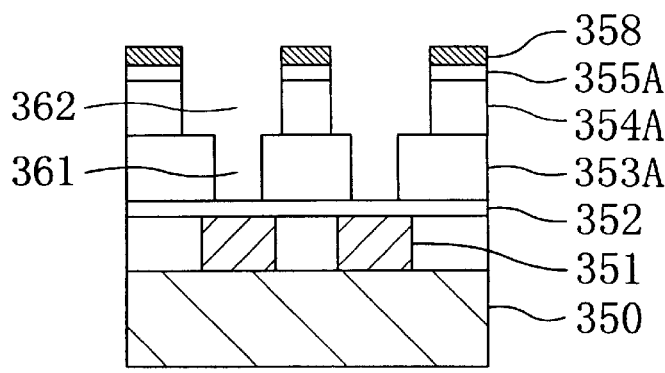

Thereafter, as shown in FIG. 16(d), the patterned organic film 354A is dry-etched using the mask pattern 358 and the patterned second silicon dioxide film 355A having the openings for forming wiring grooves as a mask, thereby forming the wiring grooves 362. In forming the wiring grooves 362, by selecting such etching conditions that the first silicon dioxide film 353A is etched at a rate sufficiently lower than that of the organic film 354A, sufficient selectivity can be secured for the patterned first silicon dioxide film 353A. Accordingly, the depth of the wiring grooves 362 can be determined univalently at the sum of the thicknesses of the second silicon dioxide film 355 and the organic film 354.

If the second resist pattern 359 may have been misaligned with the first resist pattern 357, then the mask pattern 358 should be dry-etched using the second resist pattern 359 as a mask before the second silicon dioxide film 355 is dry-etched using the second resist pattern 359 as a mask. That is to say, if the mask pattern 358 is partially exposed inside the openings of the second resist pattern 359 for forming contact holes because of the misalignment of the second resist pattern 359 with the first resist pattern 357, then the mask pattern 358 is dry-etched using the second resist pattern 359 as a mask. In this manner, the openings of the mask pattern 358 are expanded to include the openings for forming wiring grooves and contact holes.

Figure 17A:
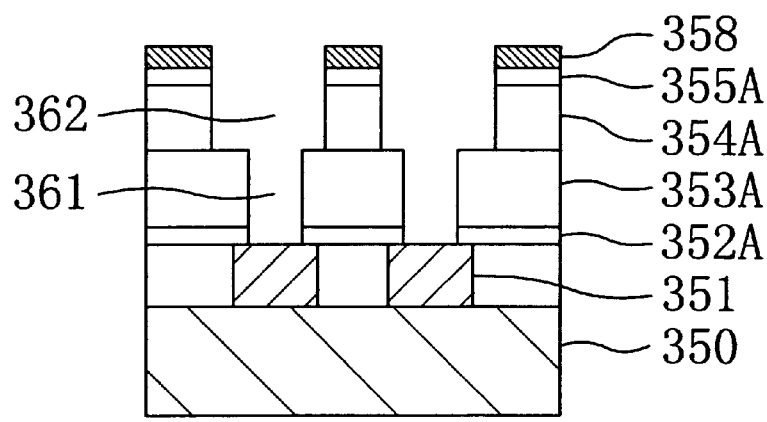
FIGS. 17(*a*) through 17(*c*) are cross-sectional views illustrating respective process steps for forming the interconnection structure of the modified example of the third embodiment.

Subsequently, the silicon nitride film 352 is dry-etched using the patterned first silicon dioxide film 353A as a mask, thereby forming a patterned silicon nitride film 352A and exposing the first metal interconnects 351 within the contact holes 361 as shown in FIG. 17(a).

Figure 17B:
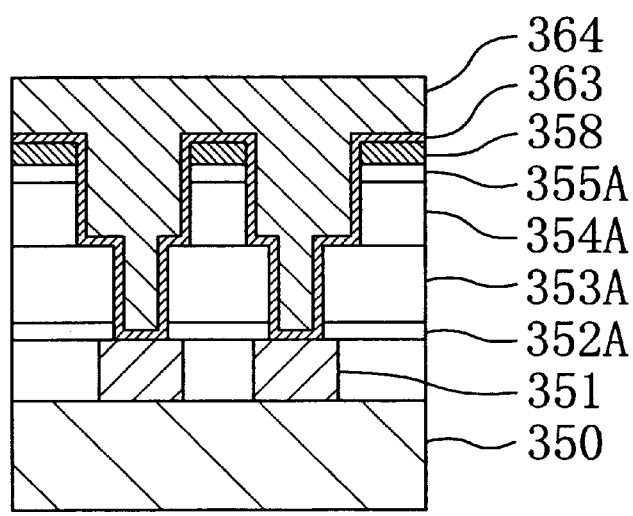

Then, as shown in FIG. 17(b), an adhesion layer 363, made of titanium nitride, is deposited to be 50 nm thick, for example, on the wall faces of the contact holes 361 and the wiring grooves 362. Thereafter, a metal film 364 is deposited over the entire surface of the substrate to completely fill in the contact holes 361 and the wiring grooves 362. In this embodiment, the metal film 364 may be made of any arbitrary metal. For example, copper, aluminum, gold, silver, nickel, cobalt, tungsten, or an alloy thereof may be used. Also, the metal film 364 may be deposited by any arbitrary technique. For instance, plating, CVD or sputtering may be employed.

Figure 17C:
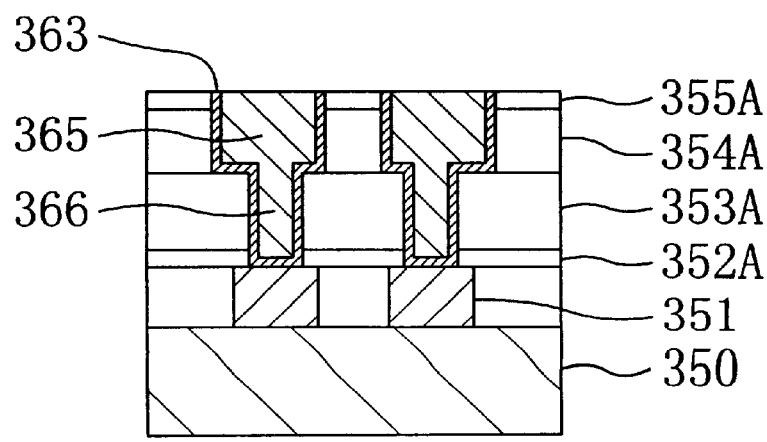

Finally, as shown in FIG. 17(c), respective portions of the adhesion layer 363, the metal film 364 and the mask pattern 358, which are deposited on the patterned second silicon dioxide film 355A, are removed by a CMP technique, for example. As a result, second metal interconnects 365 and contacts 366, connecting the first and second metal interconnects 351 and 365, are formed out of the metal film 364.

It should be noted that a multilevel interconnection structure may be formed by forming respective films, interconnects and contacts on the second metal interconnects 365 through the same process steps as those described above.

In this modified example of the third embodiment, while the first resist pattern 357 is ashed and removed by oxygen plasma, the organic film 354 is not exposed to the oxygen plasma, because the second silicon dioxide film 355 exists on the organic film 354.

Also, in this example, the second resist pattern 359 is removed while the second silicon dioxide film 355 and the organic film 354 are dry-etched using the second resist pattern 359 as a mask. Accordingly, since there is no need to ash and remove the second resist pattern 359 with oxygen plasma, the organic film 354 is not exposed to oxygen plasma.

EMBODIMENT 4

Next, an exemplary method for forming an interconnection structure according to the fourth embodiment of the present invention will be described with reference to FIGS. 18(a) through 18(c), FIGS. 19(a) through 19(c) and FIGS. 20(a) through 20(c).

Figure 18A:
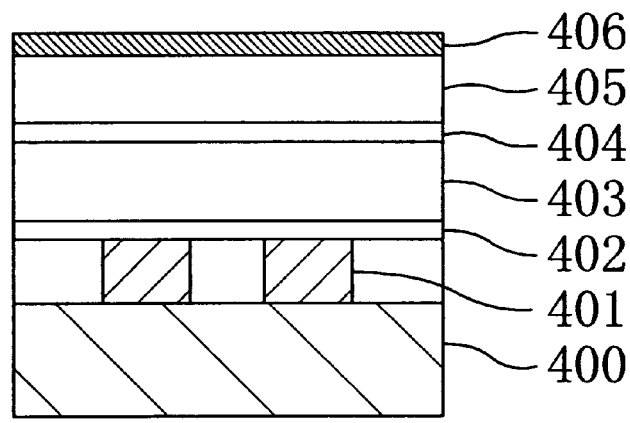
FIGS. 18(*a*) through 18(*c*) are cross-sectional views illustrating respective process steps for forming an interconnection structure according to the fourth embodiment of the present invention.

First, as shown in FIG. 18(a), a silicon nitride film 402 is formed over first metal interconnects 401 formed on a semiconductor substrate 400. The silicon nitride film 402 is formed to be 50 nm thick, for example, and to protect the first metal interconnects 401 during a subsequent etching process step. Thereafter, a first low-dielectric-constant SOG film 403 (first insulating film), having a siloxane skeleton, is formed to be 1 μm thick, for example, on the silicon nitride film 402. Next, an organic-containing silicon dioxide film 404 (second insulating film), containing an organic component in silicon dioxide, is deposited to be 50 nm thick, for example, on the first low-dielectric-constant SOG film 403. Then, a second low-dielectric-constant SOG film 405 (third insulating film), having a siloxane skeleton, is formed to be 400 nm thick, for example, on the organic-containing silicon dioxide film 404. And a titanium nitride film 406 is formed to be 50 nm thick, for example, on the second low-dielectric-constant SOG film 405.

The first and second low-dielectric-constant SOG films 403 and 405 may be HSQ films, for example. The organic-containing silicon dioxide film 404 may be deposited by any arbitrary technique. For example, the film 404 may be deposited by a CVD process using a reactive gas mainly composed of phenyltrimethoxy silane. Then, an organic-containing silicon dioxide film 404, having a structure in which a phenyl group bonded to a silicon atom is introduced into silicon dioxide, can be obtained.

It should be noted that a thin film showing high etch selectivity with respect to the first and second low-dielectric-constant SOG films 403 and 405 and the organic-containing silicon dioxide film 404, i.e., a film etched at a sufficiently low rate (e.g., silicon nitride film), may be used instead of the titanium nitride film 406.

Figure 18B:
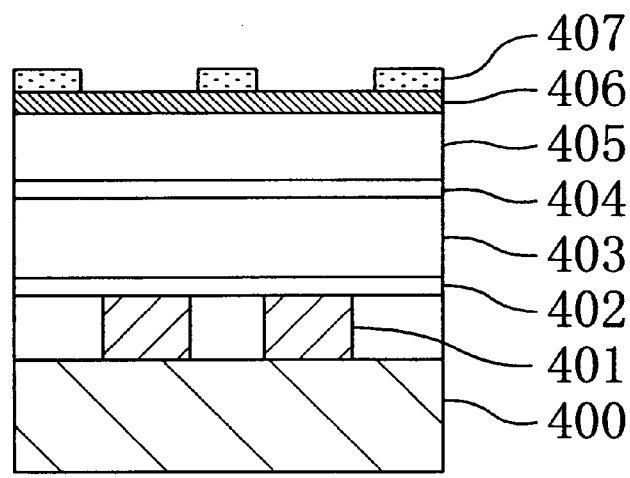
Figure 18C:
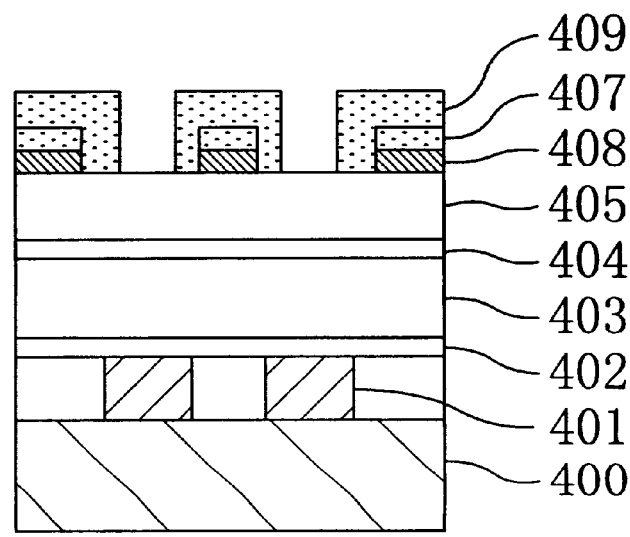

Next, as shown in FIG. 18(b), a first resist pattern 407, having openings for forming wiring grooves, is formed by lithography on the titanium nitride film 406. Thereafter, the titanium nitride film 406 is dry-etched using the first resist pattern 407 as a mask, thereby forming a mask pattern 408 out of the titanium nitride film 406 as shown in FIG. 18(c).

Figure 19A:
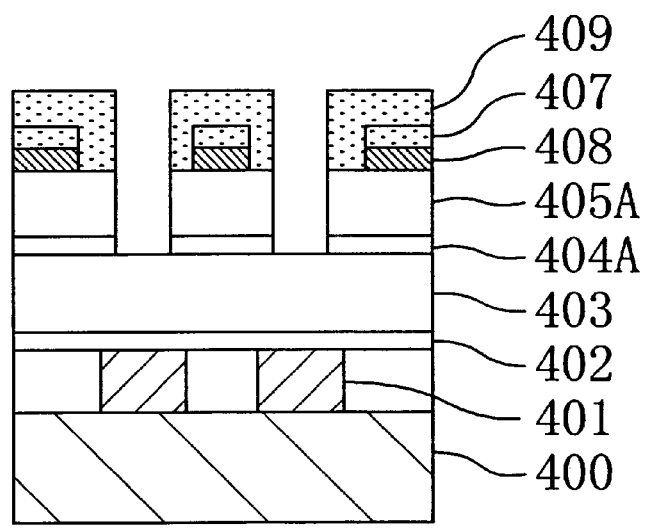
FIGS. 19(*a*) through 19(*c*) are cross-sectional views illustrating respective process steps for forming the interconnection structure of the fourth embodiment.

Subsequently, a second resist pattern 409, having openings for forming contact holes, is formed by lithography on the second low-dielectric-constant SOG film 405 without removing the first resist pattern 407. Then, the second low-dielectric-constant SOG film 405 and the organic-containing silicon dioxide film 404 are sequentially dry-etched using the second resist pattern 409 as a mask, thereby forming a patterned second low-dielectric-constant SOG film 405A and a patterned organic-containing silicon dioxide film 404A as shown in FIG. 19(a).

Figure 19B:
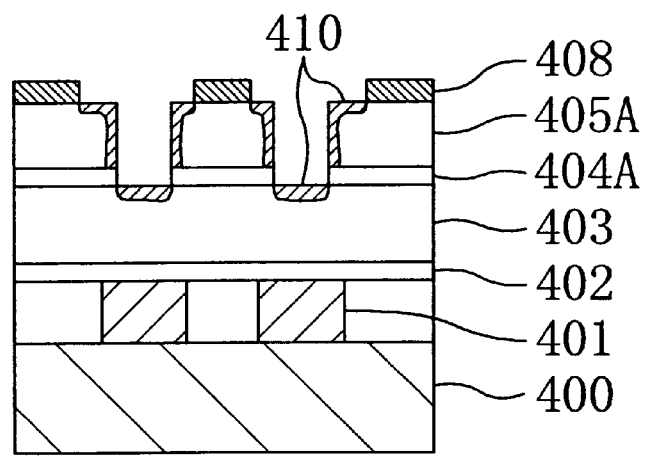

Next, the first and second resist patterns 407 and 409 are ashed and removed with oxygen plasma. As a result, a damaged layer 410 is unintentionally formed in respective portions of the patterned second low-dielectric-constant SOG film 405A and the first low-dielectric-constant SOG film 403, which are exposed inside the openings for forming contact holes, as shown in FIG. 19(b).

Figure 19C:
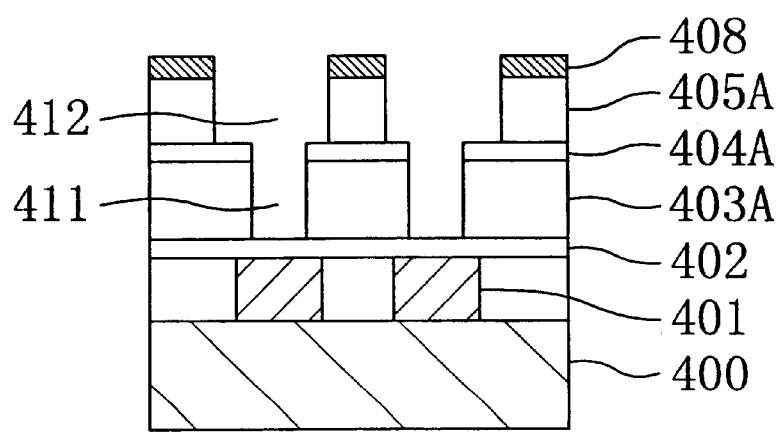

Then, the patterned second low-dielectric-constant SOG film 405A is dry-etched using the mask pattern 408 as a mask, thereby forming wiring grooves 412 in the patterned second low-dielectric-constant SOG film 405A as shown in FIG. 19(c). At the same time, the first low-dielectric-constant SOG film 403 is dry-etched using the patterned organic-containing silicon dioxide film 404A as a mask, thereby forming a patterned first low-dielectric-constant SOG film 403A having contact holes 411 as shown in FIG. 19(c). By performing this dry-etching process step, the damaged layer 410 can be removed from the patterned second low-dielectric-constant SOG films 405A and the first low-dielectric-constant SOG film 403.

Figure 20A:
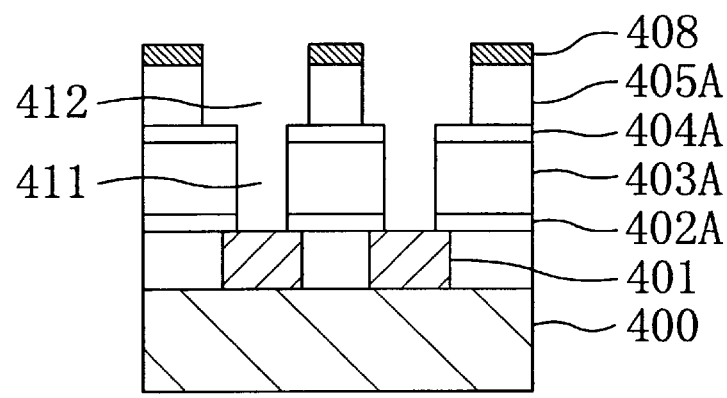
FIGS. 20(*a*) through 20(*c*) are cross-sectional views illustrating respective process steps for forming the interconnection structure of the fourth embodiment.

Subsequently, the silicon nitride film 402 is dry-etched using the patterned organic-containing silicon dioxide film 404A as a mask, thereby forming a patterned silicon nitride film 402A and exposing the first metal interconnects 401 within the contact holes 411 as shown in FIG. 20(a).

Figure 20B:
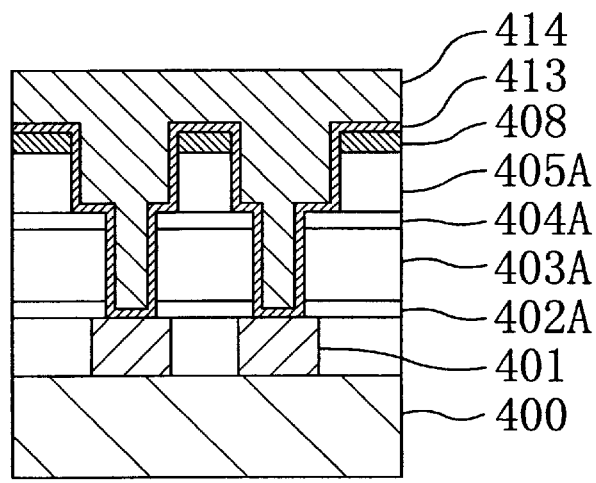

Then, as shown in FIG. 20(b), an adhesion layer 413, made of titanium nitride, is deposited to be 50 nm thick, for example, on the wall faces of the contact holes 411 and the wiring grooves 412. Thereafter, a metal film 414 is deposited over the entire surface of the substrate to completely fill in the contact holes 411 and the wiring grooves 412. In this embodiment, the metal film 414 may be made of any arbitrary metal. For example, copper, aluminum, gold, silver, nickel, cobalt, tungsten, or an alloy thereof may be used. Also, the metal film 414 may be deposited by any arbitrary technique. For instance, plating, CVD or sputtering may be employed.

Figure 20C:
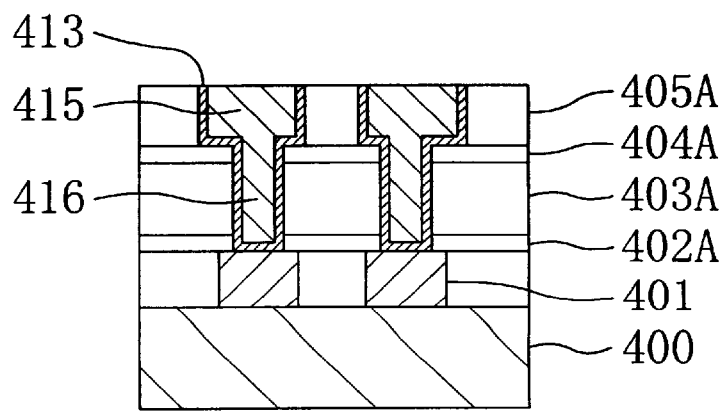

Finally, as shown in FIG. 20(c), respective portions of the adhesion layer 413, the metal film 414 and the mask pattern 408, which are deposited on the patterned second low-dielectric-constant SOG film 405A, are removed by a CMP technique, for example. As a result, second metal interconnects 415 and contacts 416, connecting the first and second metal interconnects 401 and 415, are formed out of the metal film 414.

It should be noted that a multilevel interconnection structure may be formed by forming respective films, interconnects and contacts on the second metal interconnects 415 through the same process steps as those described above.

In the fourth embodiment, while the first and second resist patterns 407 and 409 are ashed and removed with oxygen plasma, a damaged layer 410 is formed in the first low-dielectric-constant SOG film 403 and the patterned second low-dielectric-constant SOG film 405A. But the damaged layer 410 can be removed while the contact holes 411 and the wiring grooves 412 are formed.

Accordingly, the first and second low-dielectric-constant SOG films 403 and 405 may be made of a material degradable with oxygen plasma. For example, in general, if an HSQ film is exposed to oxygen plasma, Si—H bonds thereof are oxidized and the content of water and the relative dielectric constant thereof both increase to deteriorate the reliability and performance of the device. However, according to the fourth embodiment, the patterned first low-dielectric-constant SOG film 403A, in which the contact holes 411 have already been formed, and the patterned second low-dielectric-constant SOG film 405A, in which the wiring grooves 412 have already been formed, are not affected by oxygen plasma any more. Thus, even if an HSQ film is used as an interlevel insulating film, the deterioration in reliability and performance of the device can be avoided.

EMBODIMENT 5

Next, an exemplary method for forming an interconnection structure according to the fifth embodiment of the present invention will be described with reference to FIGS. 21(a) through 21(c), FIGS. 22(a) through 22(c) and FIGS. 23(a) through 23(d).

Figure 21A:
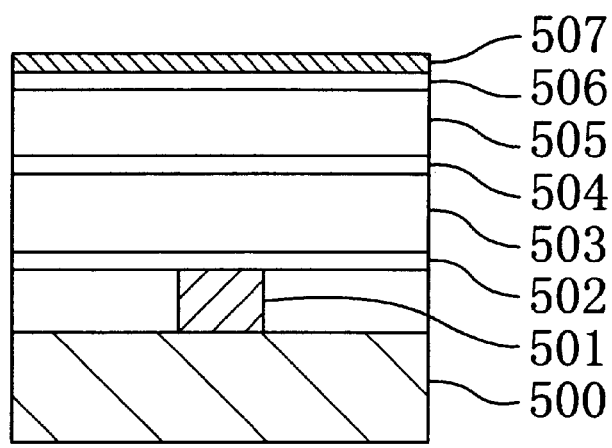
FIGS. 21(*a*) through 21(*c*) are cross-sectional views illustrating respective process steps for forming an interconnection structure according to the fifth embodiment of the present invention.

First, as shown in FIG. 21(a), a silicon nitride film 502 is formed over first metal interconnects 501 formed on a semiconductor substrate 500. The silicon nitride film 502 is formed to be 50 nm thick, for example, and to protect the first metal interconnects 501 during a subsequent etching process step. Thereafter, a first organic film 503 (first insulating film), mainly composed of an organic component, is deposited to be 400 nm thick, for example, on the silicon nitride film 502. Then, a first silicon dioxide film 504 (second insulating film) is deposited to be 100 nm thick, for example, on the first organic film 503. Subsequently, a second organic film 505 (third insulating film), mainly composed of an organic component, is deposited to be 300 nm thick, for example, on the first silicon dioxide film 504. Next, a second silicon dioxide film 506 (fourth insulating film) is deposited to be 200 nm thick, for example, on the second organic film 505. And a titanium nitride film 507 (thin film) is deposited to be 50 nm thick, for example, on the second silicon dioxide film 506.

The first and second organic films 503 and 505 may be deposited by any arbitrary technique. For example, these films 503 and 505 may be deposited by a plasma CVD process using a reactive gas mainly composed of perfluorodecalin. Also, hydrocarbon films or fluorine-containing hydrocarbon films, formed by plasma CVD, coating or thermal CVD, may be used as the first and second organic films 503 and 505. More specifically, the organic films 503 and 505 may be made of polytetrafluoroethylene, oxygen-containing polytetrafluoroethylene, polyimide fluoride or polyaryl ether.

The first and second silicon dioxide films 504 and 506 may also be deposited by any arbitrary technique. For example, these films 504 and 506 may be deposited by a plasma CVD process.

It should be noted that a thin film showing high etch selectivity with respect to the first and second organic films 503 and 505 and the first and second silicon dioxide films 504 and 506, i.e., a thin film etched at a sufficiently low rate (e.g., silicon nitride film), may be used instead of the titanium nitride film 507.

Figure 21B:
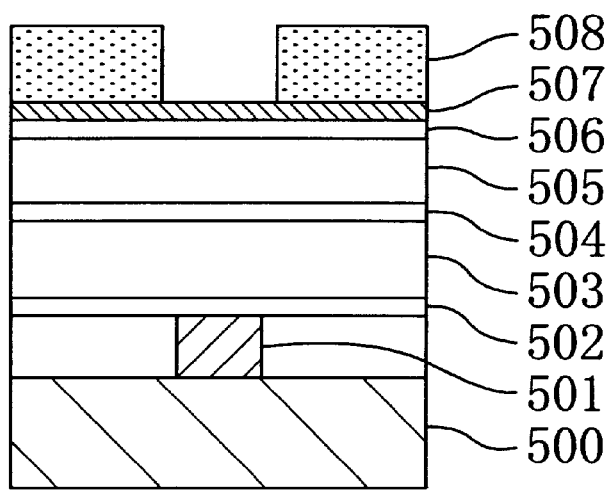
Figure 21C:
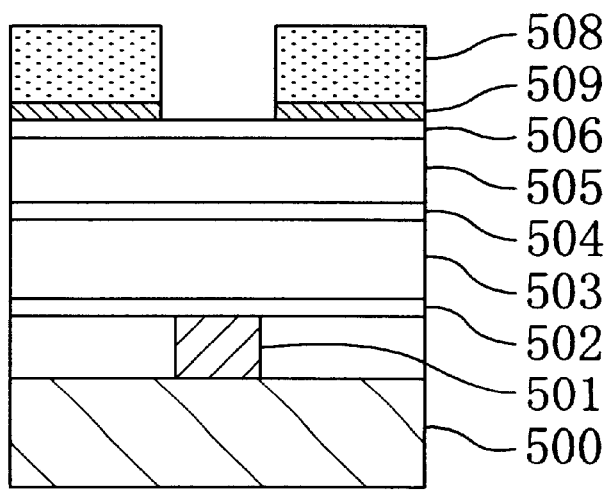

Next, as shown in FIG. 21(b), a first resist pattern 508, having openings for forming wiring grooves, is formed by lithography on the titanium nitride film 507. Thereafter, the titanium nitride film 507 is dry-etched using the first resist pattern 508 as a mask, thereby forming a mask pattern 509, having openings for forming wiring grooves, out of the titanium nitride film 507 as shown in FIG. 21(c).

Figure 22A:
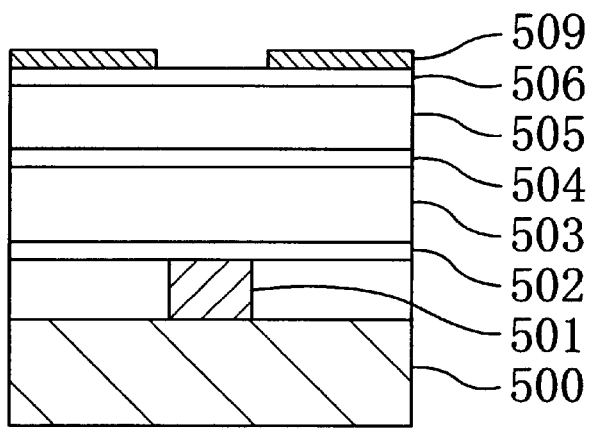
FIGS. 22(*a*) through 22(*c*) are cross-sectional views illustrating respective process steps for forming the interconnection structure of the fifth embodiment.

Subsequently, as shown in FIG. 22(a), the first resist pattern 508 is removed by oxygen plasma, for example. In this case, even if the first resist pattern 508 is ashed and removed using oxygen plasma, the quality of the second organic film 505 does not degrade, because the second silicon dioxide film 506 exists on the second organic film 505 mainly composed of an organic component.

Figure 22B:
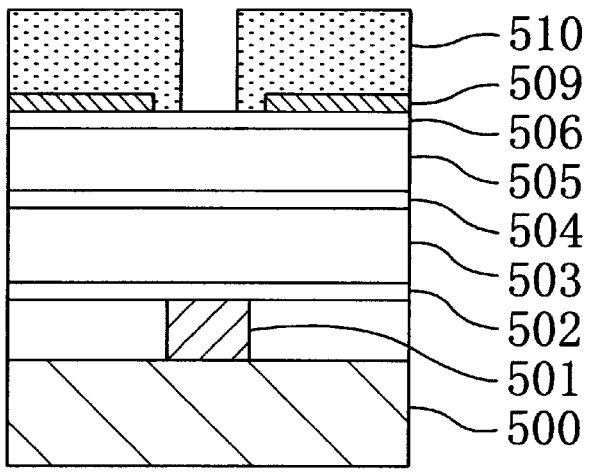
Figure 22C:
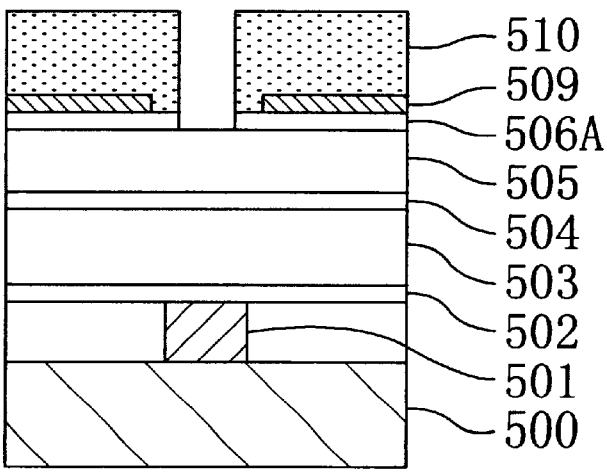

Then, as shown in FIG. 22(b), a second resist pattern 510, having openings for forming contact holes, is formed by lithography on the mask pattern 509. Thereafter, the second silicon dioxide film 506 is dry-etched using the second resist pattern 510 and the mask pattern 509 as a mask, thereby forming a patterned second silicon dioxide film 506A having openings for forming contact holes as shown in FIG. 22(c).

Figure 23A:
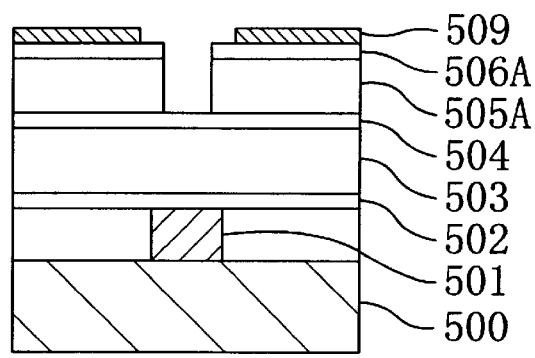
FIGS. 23(*a*) through 23(*d*) are cross-sectional views illustrating respective process steps for forming the interconnection structure of the fifth embodiment.

Next, the second organic film 505 is dry-etched using the patterned second silicon dioxide film 506A as a mask, thereby forming a patterned second organic film 505A having openings for forming contact holes as shown in FIG. 23(a). In this case, the second organic film 505 and the second resist pattern 510 are both mainly composed of organic components, the second organic film 505 is etched at a substantially equal rate to that of the second resist pattern 510. Thus, when the second organic film 505 is dry-etched, the second resist pattern 510 is also removed simultaneously. The patterned second silicon dioxide film 506A functions as an etch stopper during dry-etching the second resist pattern 510.

It should be noted that part of the second resist pattern 510 may be left in the process step of dry-etching the second organic film 505. This is because the residual second resist pattern 510 can be removed during a subsequent process step of dry-etching the first organic film 503 (see FIG. 23(c)).

Figure 23B:
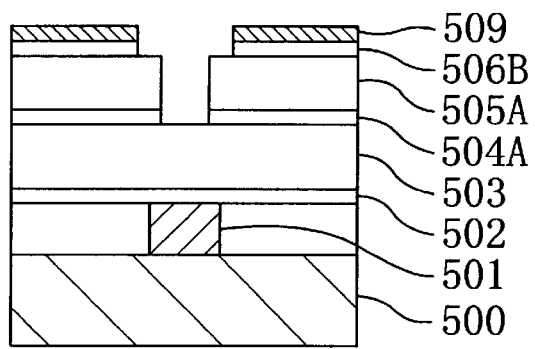

Thereafter, the patterned second silicon dioxide film 506A and the first silicon dioxide film 504 are dry-etched using the mask pattern 509 and the patterned second organic film 505A as respective masks, thereby forming a patterned second silicon dioxide film 506B having openings for forming wiring grooves and a patterned first silicon dioxide film 504A having openings for forming contact holes as shown in FIG. 23(b).

Figure 23C:
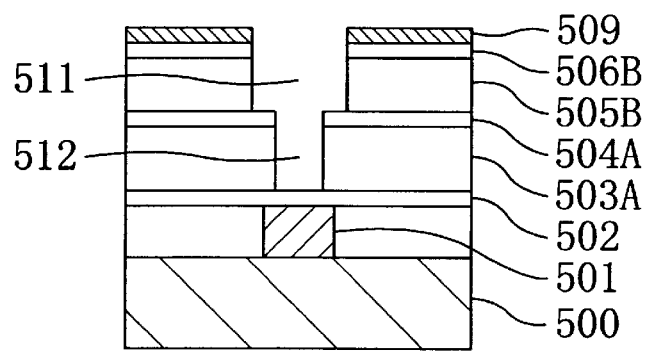

Then, the patterned second organic film 505A and the first organic film 503 are dry-etched using the mask pattern 509 and the patterned first silicon dioxide film 504A as respective masks, thereby forming a patterned second organic film 505B having wiring grooves 511 and a patterned first organic film 503A having contact holes 512 as shown in FIG. 23(c).

Figure 23D:
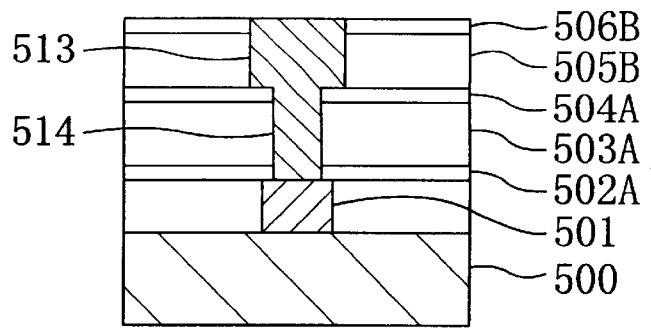

Subsequently, the silicon nitride film 502 is dry-etched using the patterned first silicon dioxide film 504A as a mask, thereby forming a patterned silicon nitride film 502A (see FIG. 23(d)) and exposing the first metal interconnects 501 within the contact holes 512. Then, although not shown, an adhesion layer, made of titanium nitride, is deposited to be 50 nm thick, for example, on the wall faces of the contact holes 512 and the wiring grooves 511 as in the first embodiment. Thereafter, a metal film is deposited over the entire surface of the substrate to completely fill in the contact holes 512 and the wiring grooves 511. In this embodiment, the metal film may be made of any arbitrary metal. For example, copper, aluminum, gold, silver, nickel, cobalt, tungsten, or an alloy thereof may be used. Also, the metal film may be deposited by any arbitrary technique. For instance, plating, CVD or sputtering may be employed. Finally, respective portions of the adhesion layer, the metal film and the mask pattern 509, which are deposited on the patterned second silicon dioxide film 506B, are removed by a CMP technique, for example. As a result, second metal interconnects 513 and contacts 514, connecting the first and second metal interconnects 501 and 513 together, are formed as shown in FIG. 23(d).

It should be noted that a multilevel interconnection structure may be formed by forming respective films, interconnects and contacts on the second metal interconnects 513 through the same process steps as those described above.

In the fifth embodiment, while the first resist pattern 508 is being removed by oxygen plasma, for example, the quality of the second organic film 505 does not degrade. This is because the second silicon dioxide film 506 exists on the second organic film 505, which is likely to be damaged by oxygen plasma.

Also, in this embodiment, the first silicon dioxide film 504 functions as an etch stopper during dry-etching the second organic film 505. Accordingly, it is possible to prevent the quality of the first organic film 503 from being degraded.

MODIFIED EXAMPLE OF EMBODIMENT 5

Next, a method for forming an interconnection structure according to a modified example of the fifth embodiment will be described with reference to FIGS. 24(a) through 24(c), FIGS. 25(a) through 25(c), FIGS. 26(a) through 26(d), FIGS. 27(a) and 27(b), FIGS. 28(a) and 28(b) and FIGS. 29(a) and 29(b).

Figure 24A:
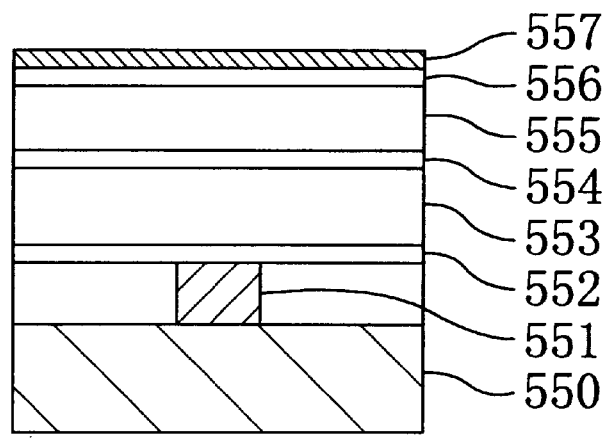
FIGS. 24(*a*) through 24(*c*) are cross-sectional views illustrating respective process steps for forming an interconnection structure according to a modified example of the fifth embodiment.

First, as shown in FIG. 24(a), a silicon nitride film 552 is formed over first metal interconnects 551 formed on a semiconductor substrate 550. The silicon nitride film 552 is formed to be 50 nm thick, for example, and to protect the first metal interconnects 551 during a subsequent etching process step. Thereafter, a first organic film 553 (first insulating film), mainly composed of an organic component, is deposited to be 400 nm thick, for example, on the silicon nitride film 552. Then, a first silicon dioxide film 554 (second insulating film) is formed to be 100 nm thick, for example, on the first organic film 553. Subsequently, a second organic film 555 (third insulating film), mainly composed of an organic component, is deposited to be 300 nm thick, for example, on the first silicon dioxide film 554. Next, a second silicon dioxide film 556 (fourth insulating film) is deposited to be 200 nm thick, for example, on the second organic film 555. And a titanium nitride film 557 is deposited to be 50 nm thick, for example, on the second silicon dioxide film 556.

The first and second organic films 553 and 555 and the first and second silicon dioxide films 554 and 566 may be deposited by any arbitrary technique as in the fifth embodiment. Also, a thin film showing high etch selectivity with respect to the first and second organic films 553 and 555 and the first and second silicon dioxide films 554 and 556 may be used instead of the titanium nitride film 557.

Figure 24B:
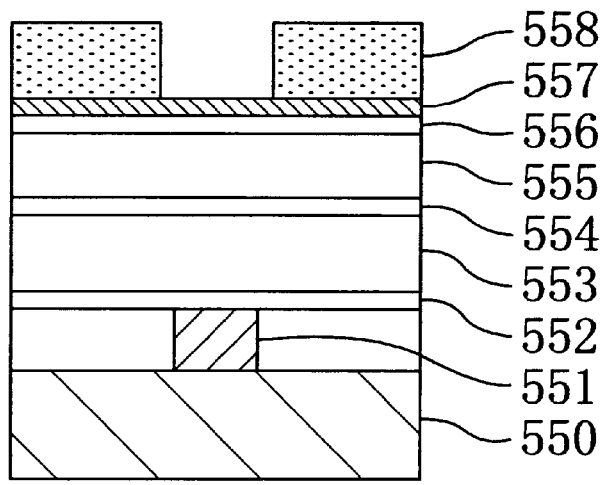
Figure 24C:
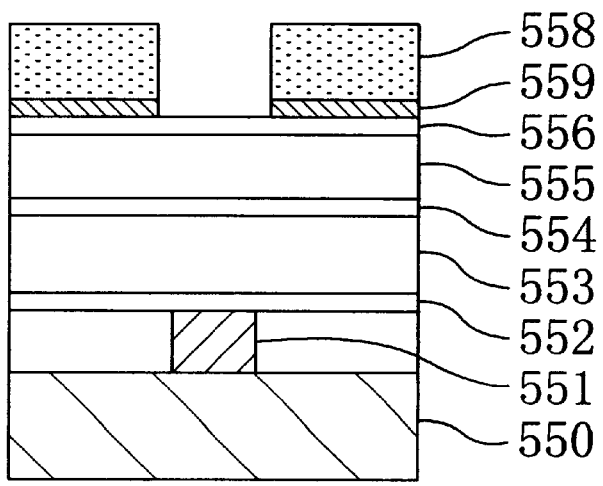

Next, as shown in FIG. 24(b), a first resist pattern 558, having openings for forming wiring grooves, is formed on the titanium nitride film 557. Thereafter, the titanium nitride film 557 is dry-etched using the first resist pattern 558 as a mask, thereby forming a mask pattern 559, having openings for forming wiring grooves, out of the titanium nitride film 557 as shown in FIG. 24(c).

Figure 25A:
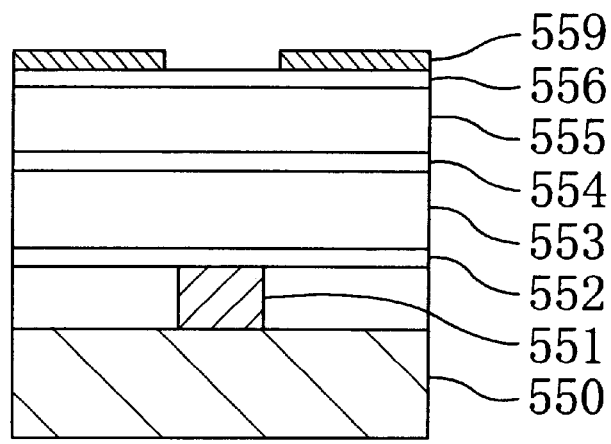
FIGS. 25(*a*) through 25(*c*) are cross-sectional views illustrating respective process steps for forming the interconnection structure in the modified example of the fifth embodiment.
Figure 25B:
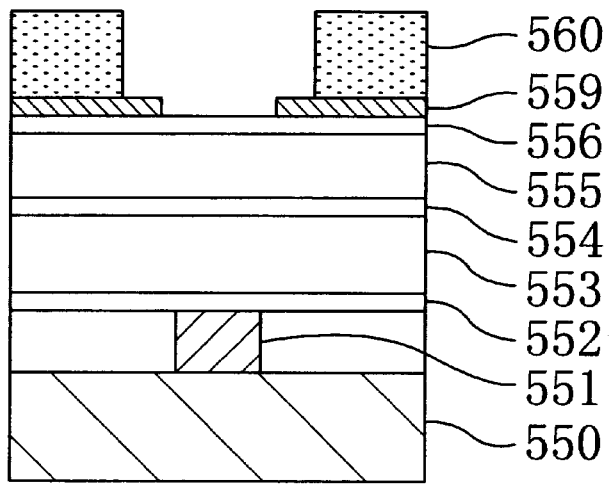
Figure 27A:
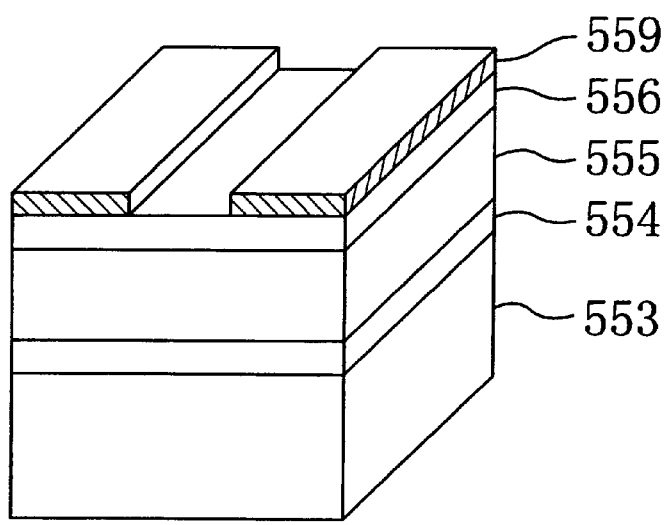
FIGS. 27(*a*) and 27(*b*) are perspective views illustrating respective process steps for forming the interconnection structure in the modified example of the fifth embodiment.

Subsequently, as shown in FIGS. 25(a) and 27(a), the first resist pattern 558 is removed. Then, a second resist pattern 560, having openings for forming contact holes, is formed on the mask pattern 559 as shown in FIG. 25(b). in this modified example of the fifth embodiment, the sizes of the openings of the second resist pattern 560 for forming contact holes are set larger than designed sizes of the contact holes in respective directions vertical and parallel to wiring grooves for forming second metal interconnects. The reason thereof will be described later.

Figure 25C:
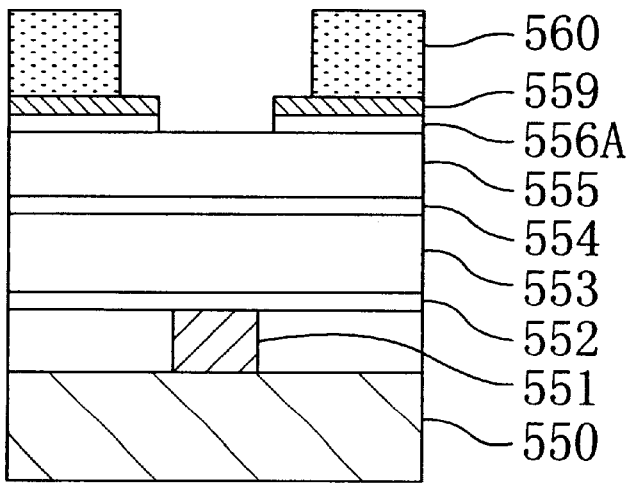
Figure 27B:
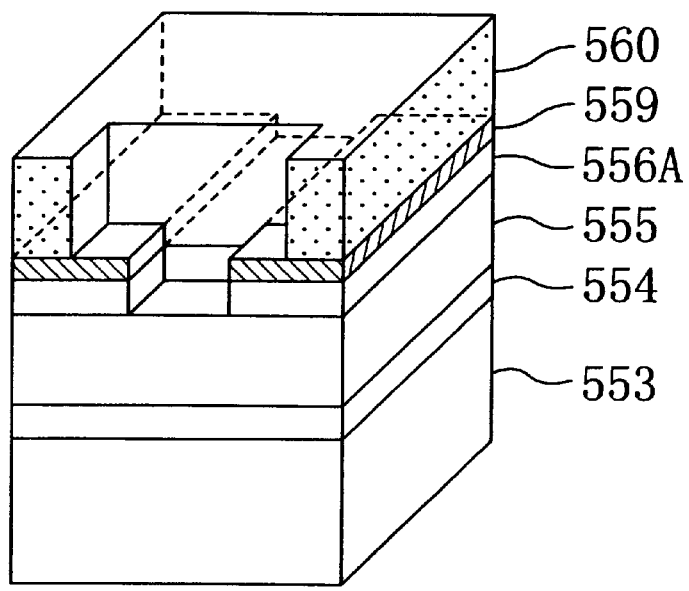

Then, the second silicon dioxide film 556 is dry-etched using the second resist pattern 560 and the mask pattern 559 as a mask, thereby forming a patterned second silicon dioxide film 556A having openings for forming contact holes as shown in FIGS. 25(c) and 27(b).

As described above, the sizes of the openings of the second resist pattern 560 for forming contact holes are set larger than designed sizes of the contact holes in respective directions vertical and parallel to wiring grooves for forming second metal interconnects. Accordingly, even if the openings of the second resist pattern 560 for forming contact holes have misaligned with the openings of the mask pattern 559 for forming wiring grooves, the openings of the patterned second silicon dioxide film 556A for forming contact holes can be formed to be self-aligned with the openings of the mask pattern 559 for forming wiring grooves. This is because the openings of the patterned second silicon dioxide film 556A for forming contact holes are formed in respective regions where the openings of the second resist pattern 560 for forming contact holes overlap with corresponding openings of the mask pattern 559 for forming wiring grooves.

In addition, the size of the openings of the second resist pattern 560 for forming contact holes is also extended in the direction parallel to the wiring grooves for forming second metal interconnects. Thus, the contact area between contacts 564 to be formed later and second metal interconnects 563 (see FIG. 26(d)) expands. As a result, the contacts 564 can connect the first and second metal interconnects 551 and 563 together with a lot more certainty.

Figure 26A:
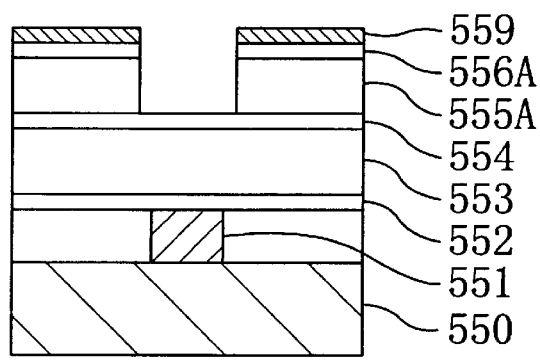
FIGS. 26(*a*) through 26(*d*) are cross-sectional views illustrating respective process steps for forming the interconnection structure in the modified example of the fifth embodiment.
Figure 28A:
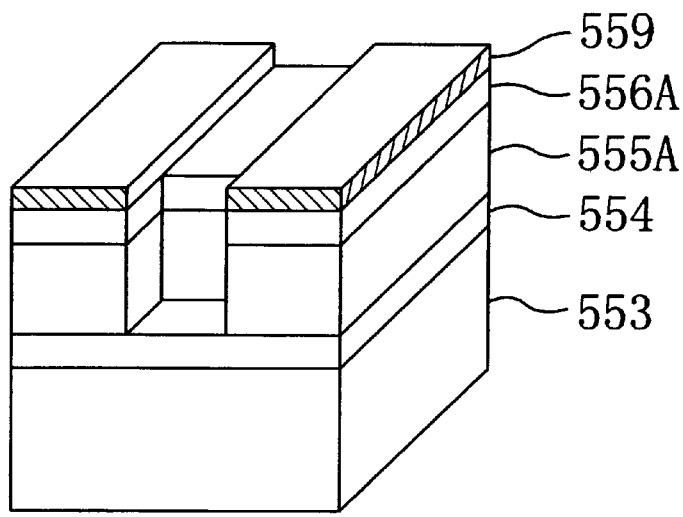
FIGS. 28(*a*) and 28(*b*) are perspective views illustrating respective process steps for forming the interconnection structure in the modified example of the fifth embodiment.

Next, the second organic film 555 is dry-etched using the patterned second silicon dioxide film 556A as a mask, thereby forming a patterned second organic film 555A having openings for forming contact holes as shown in FIGS. 26(a) and 28(a). In this case, the second organic film 555 and the second resist pattern 560 are both mainly composed of organic components, the second organic film 555 is etched at a substantially equal rate to that of the second resist pattern 560. Thus, when the second organic film 555 is dry-etched, the second resist pattern 560 is also removed simultaneously. It should be noted that part of the second resist pattern 560 may be left in the process step of dry-etching the second organic film 555. This is because the residual second resist pattern 560 can be removed during a subsequent process step of dry-etching the first organic film 553 (see FIG. 26(c)).

Figure 26B:
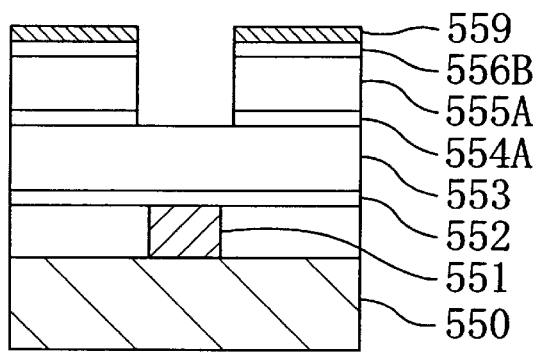
Figure 26C:
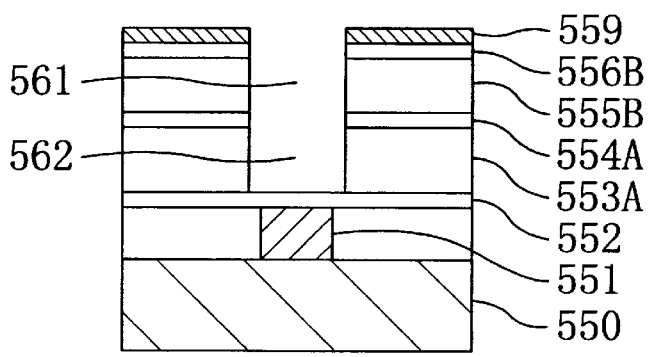
Figure 28B:
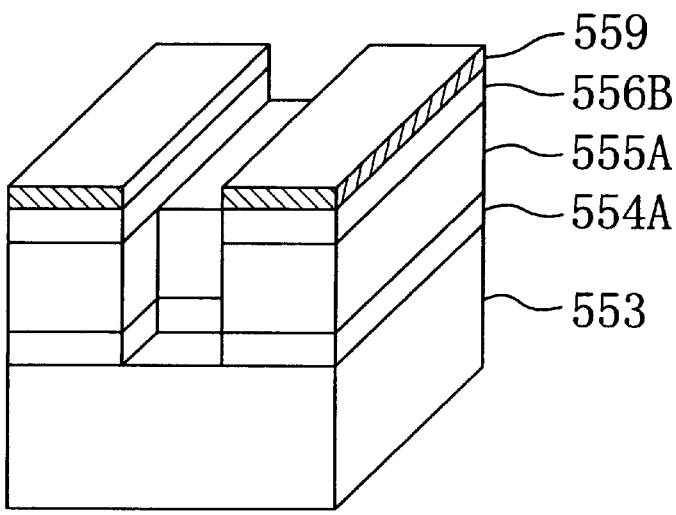
Figure 29A:
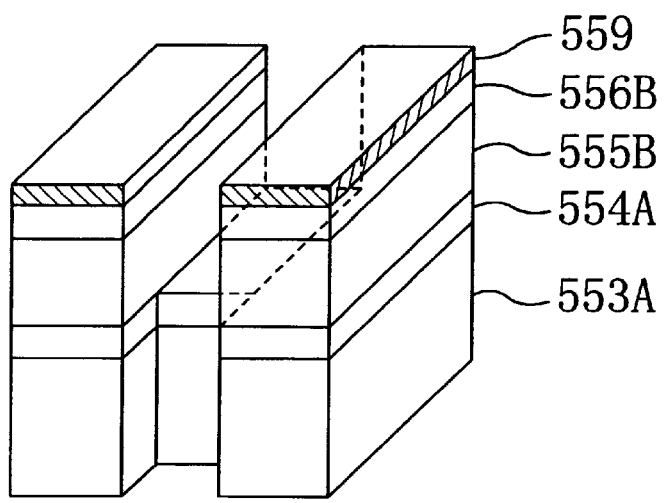
FIGS. 29(*a*) and 29(*b*) are perspective views illustrating respective process steps for forming the interconnection structure in the modified example of the fifth embodiment.

Thereafter, the patterned second silicon dioxide film 556A and the first silicon dioxide film 554 are dry-etched using the mask pattern 559 and the patterned second organic film 555A as respective masks, thereby forming a patterned second silicon dioxide film 556B having wiring grooves and a patterned first silicon dioxide film 554A having openings for forming contact holes as shown in FIGS. 26(b) and 28(b). Then, the patterned second organic film 555A is dry-etched using the mask pattern 559 and the patterned second silicon dioxide film 556B as a mask, and the first organic film 553 is dry-etched using the patterned first silicon dioxide film 554A as a mask, thereby forming a patterned second organic film 555B having wiring grooves 561 and a patterned first organic film 553A having contact holes 562 as shown in FIGS. 26(c) and 29(a).

Figure 26D:
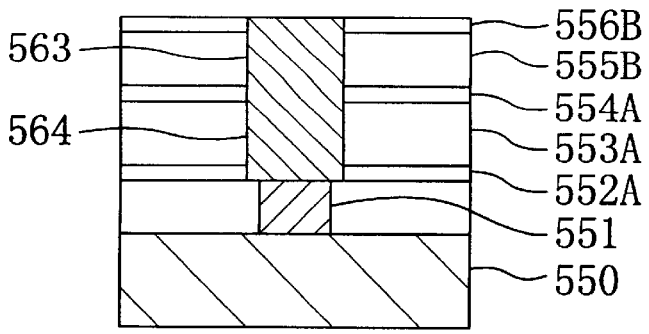
Figure 29B:
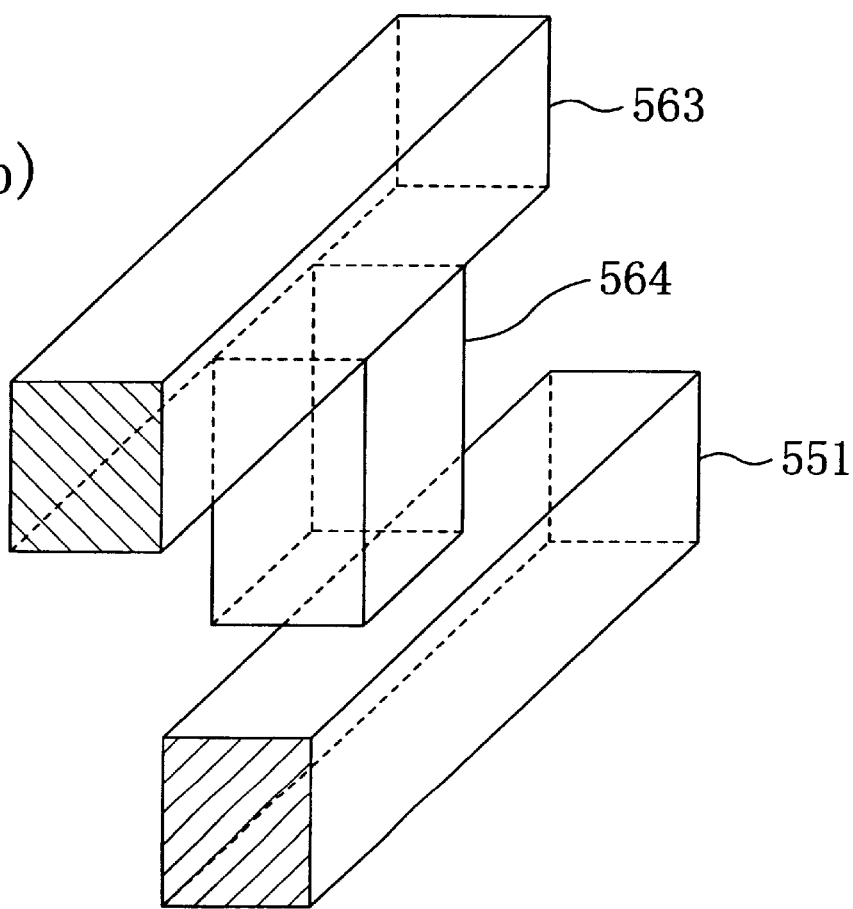

Subsequently, the silicon nitride film 552 is dry-etched using the patterned first silicon dioxide film 554A as a mask, thereby forming a patterned silicon nitride film 552A (see FIG. 26(d)) having contact holes, and exposing the first metal interconnects 551 within the contact holes 562. Then, although not shown, an adhesion layer, made of titanium nitride, is deposited to be 50 nm thick, for example, on the wall faces of the contact holes 562 and the wiring grooves 561 as in the first embodiment. Thereafter, a metal film is deposited over the entire surface of the substrate to completely fill in the contact holes 562 and the wiring grooves 561. Finally, respective portions of the adhesion layer, the metal film and the mask pattern 559, which are deposited on the patterned second silicon dioxide film 556B, are removed by a CMP technique, for example. As a result, second metal interconnects 563 and contacts 564, connecting the first and second metal interconnects 551 and 563 together, are formed as shown in FIGS. 26(d) and 29(b).

It should be noted that a multilevel interconnection structure may be formed by forming respective films, interconnects and contacts on the second metal interconnects 563 through the same process steps as those described above.

According to this modified example of the fifth embodiment, the sizes of the openings of the second resist pattern 560 for forming contact holes are set larger than designed sizes of the contact holes in respective directions vertical and parallel to the wiring grooves for forming the second metal interconnects. Thus, even if the openings of the second resist pattern 560 for forming contact holes have misaligned with the openings of the mask pattern 559 for forming wiring grooves, the openings of the patterned second silicon dioxide film 556A for forming contact holes can be formed to be self-aligned with the openings of the mask pattern 559 for forming wiring grooves. This is because the openings of the patterned second silicon dioxide film 556A for forming contact holes are formed in respective regions where the openings of the second resist pattern 560 for forming contact holes overlap with corresponding openings of the mask pattern 559 for forming wiring grooves. Accordingly, the connection between the contacts 564 and the second metal interconnects 563 is ensured.

In addition, the size of the openings of the second resist pattern 560 for forming contact holes is also extended in the direction parallel to the wiring grooves for forming the second metal interconnects. Thus, the contact area between contacts 564 and the second metal interconnects 563 expands. As a result, the contacts 564 can connect the first and second metal interconnects 551 and 563 together with a lot more certainty.

Figure 36:
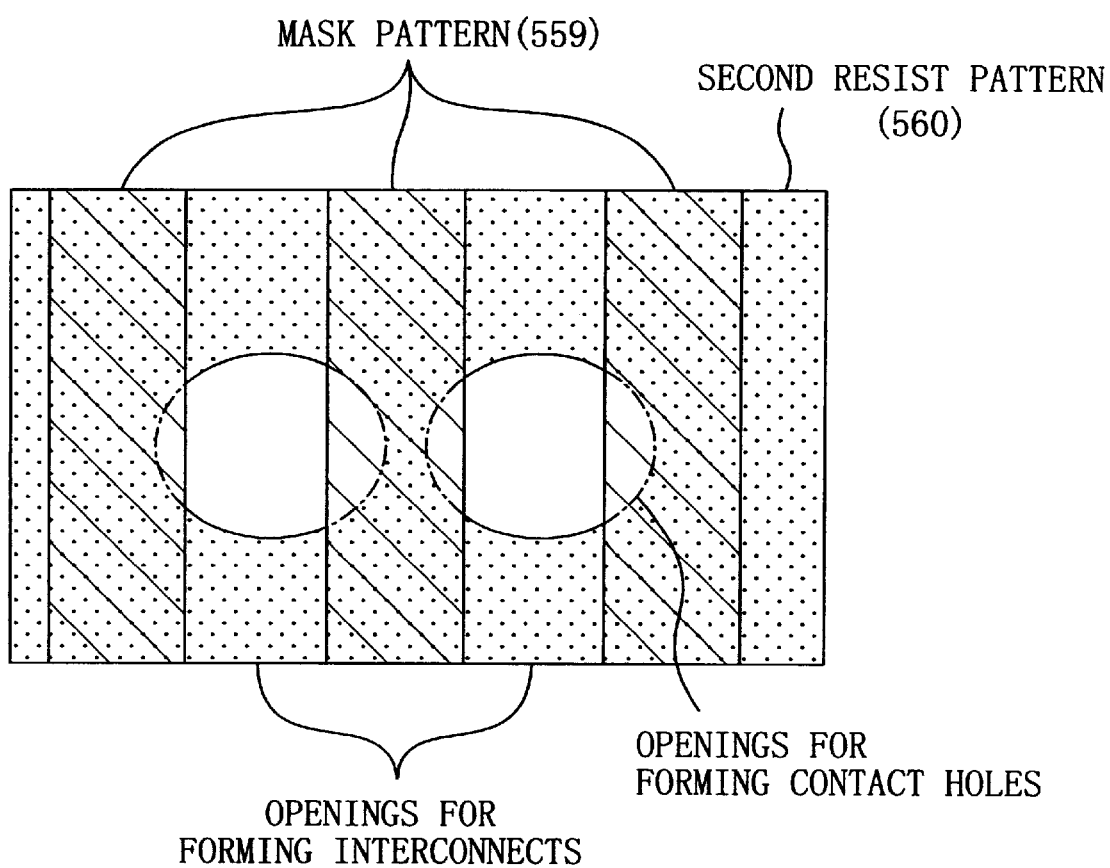
FIG. 36 is a plan view illustrating a positional relationship between the openings of a mask pattern for forming wiring grooves and the openings of a second resist pattern for forming contact holes in the modified example of the fifth embodiment.

FIG. 36 illustrates a positional relationship between the openings of the mask pattern 559 for forming wiring grooves and those of the second resist pattern 560 for forming contact holes in this modified example of the fifth embodiment. As shown in FIG. 36, the size of the openings of the second resist pattern 560 for forming contact holes are larger than the designed size.

FIG. 37(a) illustrates respective positional relationships between the mask pattern 559 and the second resist pattern 560 and between a first metal interconnect 551 and a contact 564 in this modified example of the fifth embodiment. Specifically, the upper part of FIG. 37(a) illustrates a positional relationship between an opening of the mask pattern 559 for forming a wiring groove and an associated opening of the second resist pattern 560 for forming a contact hole. The middle part of FIG. 37(a) illustrates the cross section of the upper part taken along the line A—A. And the lower part of FIG. 37(a) illustrates a positional relationship between a first metal interconnect 551 and an associated contact 564. FIG. 37(b) illustrates respective positional relationships between the mask pattern 509 and the second resist pattern 510 and between a first metal interconnect 501 and a contact 514 in the fifth embodiment. Specifically, the upper part of FIG. 37(b) illustrates a positional relationship between an opening of the mask pattern 509 for forming a wiring groove and an associated opening of the second resist pattern 510 for forming a contact hole. The middle part of FIG. 37(b) illustrates the cross section of the upper part taken along the line B—B. And the lower part of FIG. 37(b) illustrates a positional relationship between a first metal interconnect 501 and an associated contact 514.

Setting the size of an opening of the second resist pattern 510 for forming a contact hole at the designed size thereof as in the fifth embodiment, if the opening of the second resist pattern 510 for forming a contact hole has misaligned with an associated opening of the mask pattern 509 for forming a wiring groove, then the contact area (indicated by hatching) between the contact 514 and the first metal interconnect 501 greatly decreases as can be seen from FIG. 37(b). In contrast, setting the size of an opening of the second resist pattern 560 for forming a contact hole larger than the designed size thereof as in this modified example of the fifth embodiment, even if the opening of the second resist pattern 560 for forming a contact hole has misaligned with an associated opening of the mask pattern 559 for forming a wiring groove, the contact area (indicated by hatching) between the contact 564 and the first metal interconnect 551 does not decrease so much as can be seen from FIG. 37(a).

EMBODIMENT 6

Next, an exemplary method for forming an interconnection structure according to the sixth embodiment of the present invention will be described with reference to FIGS. 30(a) through 30(c), FIGS. 31(a) through 31(c) and FIGS. 32(a) through 32(c).

Figure 30:
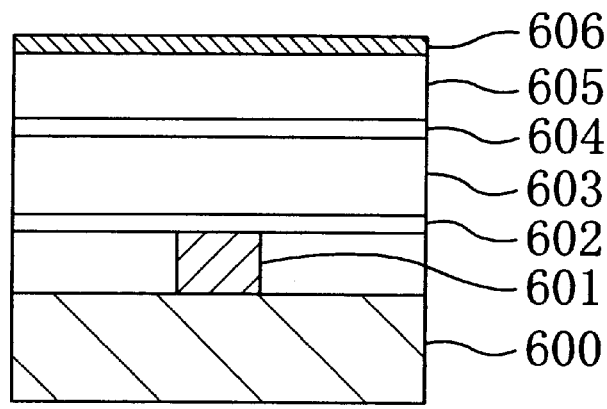
FIGS. 30(*a*) through 30(*c*) are cross-sectional views illustrating respective process steps for forming an interconnection structure according to the sixth embodiment of the present invention.
Figure 30:
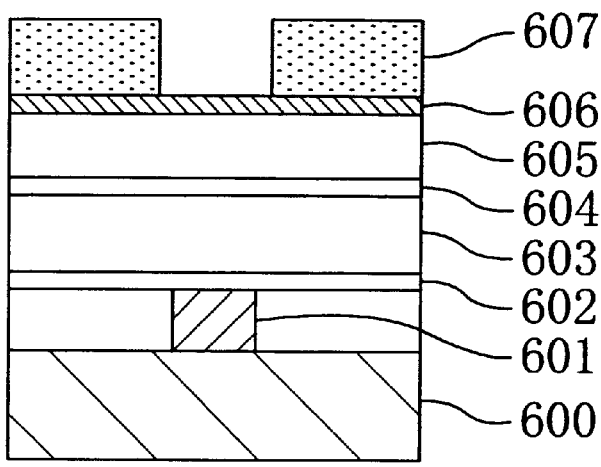
Figure 30:
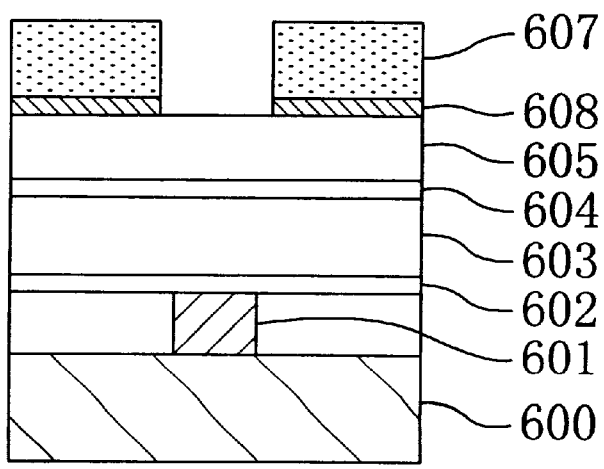

First, as shown in FIG. 30(a), a silicon nitride film 602 is formed over first metal interconnects 601 formed on a semiconductor substrate 600. The silicon nitride film 602 is formed to be 50 nm thick, for example, and to protect the first metal interconnects 601 during a subsequent etching process step. Thereafter, a first organic film 603 (first insulating film), mainly composed of an organic component, is deposited to be 400 nm thick, for example, on the silicon nitride film 602. Then, a silicon dioxide film 604 (second insulating film) is deposited to be 100 nm thick, for example, on the first organic film 603. Subsequently, a second organic film 605 (third insulating film), mainly composed of an organic component, is deposited to be 300 nm thick, for example, on the silicon dioxide film 604. And a titanium nitride film 606 (thin film) is deposited to be 50 nm thick, for example, on the second organic film 605.

The first and second organic films 603 and 605 may be deposited by any arbitrary technique. For example, these films 603 and 605 may be deposited by a plasma CVD process using a reactive gas mainly composed of perfluorodecalin. Also, hydrocarbon films or fluorine-containing hydrocarbon films, formed by plasma CVD, coating or thermal CVD, may be used as the first and second organic films 603 and 605. More specifically, the organic films 603 and 605 may be made of polytetrafluoroethylene, oxygen-containing polytetrafluoroethylene, polyimide fluoride or polyaryl ether.

The silicon dioxide film 604 may also be deposited by any arbitrary technique. For example, the film 604 may be deposited by a plasma CVD process.

It should be noted that a thin film showing high etch selectivity with respect to the first and second organic films 603 and 605 and the silicon dioxide film 604, i.e., a thin film etched at a sufficiently low rate (e.g., silicon nitride film), may be used instead of the titanium nitride film 606.

Next, as shown in FIG. 30(b), a first resist pattern 607, having openings for forming wiring grooves, is formed by lithography on the titanium nitride film 606. Thereafter, the titanium nitride film 606 is dry-etched using the first resist pattern 607 as a mask, thereby forming a mask pattern 608, having openings for forming wiring grooves, out of the titanium nitride film 606 as shown in FIG. 30(c).

Figure 31A:
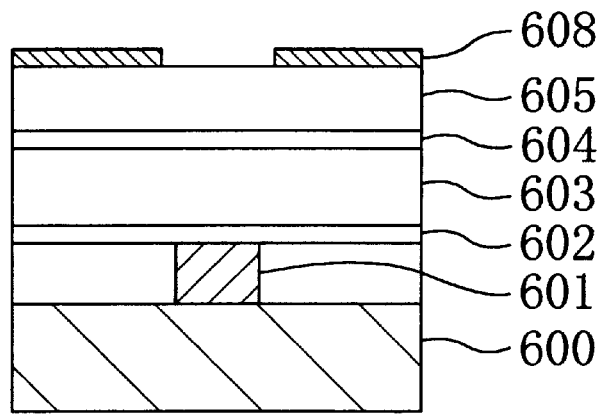
FIGS. 31(*a*) through 31(*c*) are cross-sectional views illustrating respective process steps for forming the interconnection structure of the sixth embodiment.

Subsequently, as shown in FIG. 31(a), the first resist pattern 607 is removed using an organic parting agent, for example. In such a case, since the second organic film 605 is not exposed to oxygen plasma, the quality of the second organic film 605 does not degrade.

Figure 31B:
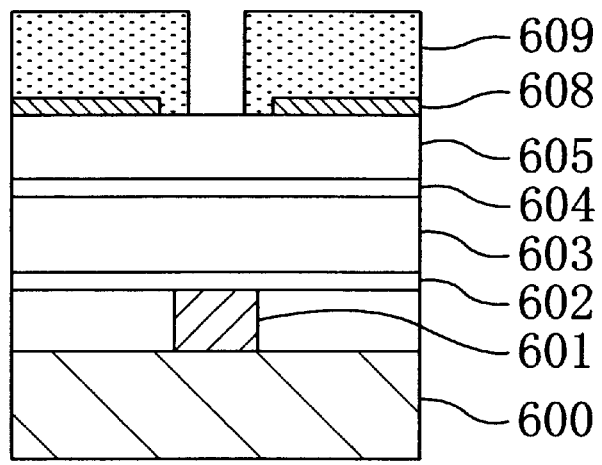
Figure 31C:
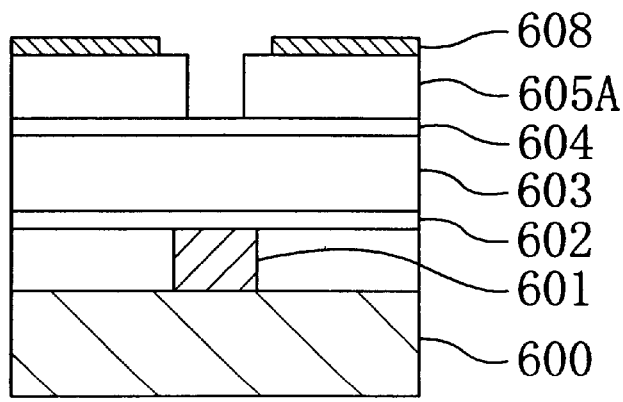

Then, as shown in FIG. 31(b), a second resist pattern 609, having openings for forming contact holes, is formed by lithography on the mask pattern 608. Then, the second organic film 605 is dry-etched using the second resist pattern 609 and the mask pattern 608 as a mask, thereby forming a patterned second organic film 605A having openings for forming contact holes as shown in FIG. 31(c). In this case, the second organic film 605 and the second resist pattern 609 are both mainly composed of organic components, the second organic film 605 is etched at a substantially equal rate to that of the second resist pattern 609. Thus, when the second organic film 605 is dry-etched, the second resist pattern 609 is also removed simultaneously.

It should be noted that part of the second resist pattern 609 may be left in the process step of dry-etching the second organic film 605. This is because the residual second resist pattern 609 can be removed during a subsequent process step of dry-etching the first organic film 603 (see FIG. 32(b)).

Figure 32A:
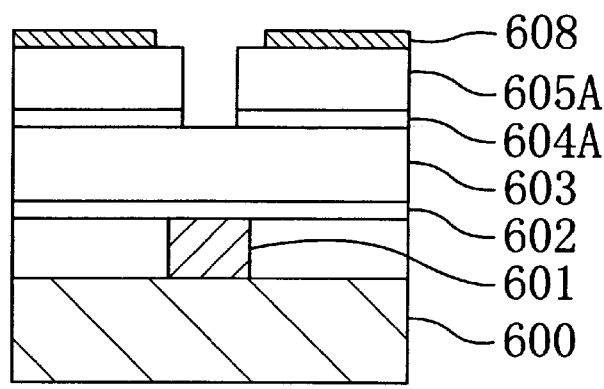
FIGS. 32(*a*) through 32(*c*) are cross-sectional views illustrating respective process steps for forming the interconnection structure of the sixth embodiment.

Thereafter, the silicon dioxide film 604 is dry-etched using the patterned second organic film 605A as a mask, thereby forming a patterned silicon dioxide film 604A having openings for forming contact holes as shown in FIG. 32(a).

Figure 32B:
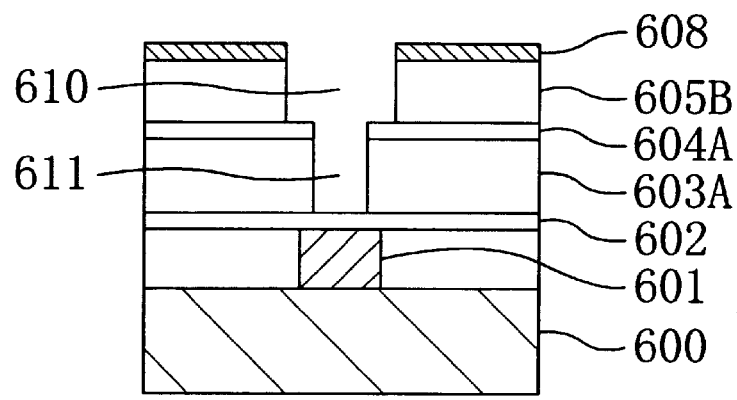

Then, the patterned second organic film 605A and the first organic film 603 are dry-etched using the mask pattern 608 and the patterned silicon dioxide film 604A as respective masks, thereby forming a patterned second organic film 605B having wiring grooves 610 and a patterned first organic film 603A having contact holes 611 as shown in FIG. 32(b).

Figure 32C:
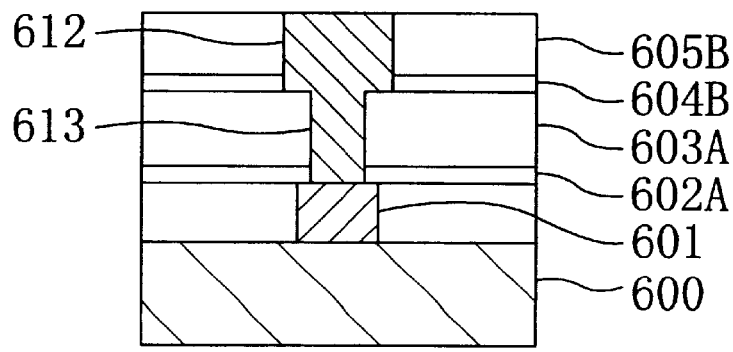

Subsequently, the patterned silicon dioxide film 604A and the silicon nitride film 602 are dry-etched using the mask pattern 608 and the patterned first organic film 603A as respective masks, thereby forming a patterned silicon dioxide film 604B having wiring grooves (see FIG. 32(c)) and a patterned silicon nitride film 602A having the contact holes (see FIG. 32(c)), and exposing the first metal interconnects 601 within the contact holes 611. Then, although not shown, an adhesion layer, made of titanium nitride, is deposited to be 50 nm thick, for example, on the wall faces of the contact holes 611 and the wiring grooves 610 as in the first embodiment. Thereafter, a metal film is deposited over the entire surface of the substrate to completely fill in the contact holes 611 and the wiring grooves 610. In this embodiment, the metal film may be made of any arbitrary metal. For example, copper, aluminum, gold, silver, nickel, cobalt, tungsten, or an alloy thereof may be used. Also, the metal film may be deposited by any arbitrary technique. For instance, plating, CVD or sputtering may be employed. Finally, respective portions of the adhesion layer, the metal film and the mask pattern 608, which are deposited on the patterned second organic film 605B, are removed by a CMP technique, for example. As a result, second metal interconnects 612 and contacts 613, connecting the first and second metal interconnects 601 and 612 together, are formed as shown in FIG. 32(c).

It should be noted that a multilevel interconnection structure may be formed by forming respective films, interconnects and contacts on the second metal interconnects 612 through the same process steps as those described above.

In the sixth embodiment, a patterned second organic film 605B, having wiring grooves 610, and a patterned first organic film 603A, having contact holes 611, are formed by a single dry-etching process using the mask pattern 608, having the openings for forming wiring grooves, and the patterned silicon dioxide film 604A as respective masks. That is to say, the wiring grooves 610 and the contact holes 611 can be formed during the same etching process step. Accordingly, a dual damascene structure can be formed with the increase in number of process steps suppressed.

Also, in the sixth embodiment, since the first resist pattern 607 is removed by an organic parting agent, for example, the quality of the second organic film 605 does not degrade.

Furthermore, in this embodiment, the silicon dioxide film 604 functions as an etch stopper during dry-etching the second organic film 605. Accordingly, it is possible to prevent the quality of the first organic film 603 from being degraded.

MODIFIED EXAMPLE OF EMBODIMENT 6

Next, a method for forming an interconnection structure according to a modified example of the sixth embodiment will be described with reference to FIGS. 33(a) through 33(c), FIGS. 34(a) through 34(c) and FIGS. 35(a) through 35(c).

Figure 33A:
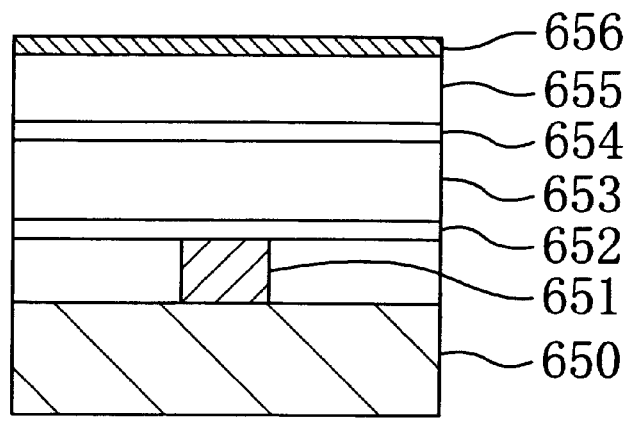
FIGS. 33(*a*) through 33(*c*) are cross-sectional views illustrating respective process steps for forming an interconnection structure according to a modified example of the sixth embodiment.

First, as shown in FIG. 33(a), a silicon nitride film 652 is formed over first metal interconnects 651 formed on a semiconductor substrate 650. The silicon nitride film 652 is formed to be 50 nm thick, for example, and to protect the first metal interconnects 651 during a subsequent etching process step. Thereafter, a first organic film 653 (first insulating film), mainly composed of an organic component, is deposited to be 400 nm thick, for example, on the silicon nitride film 652. Then, a silicon dioxide film 654 (second insulating film) is deposited to be 100 nm thick, for example, on the first organic film 653. Subsequently, a second organic film 655 (third insulating film), mainly composed of an organic component, is deposited to be 300 nm thick, for example, on the silicon dioxide film 654. And a titanium nitride film 656 (thin film) is deposited to be 50 nm thick, for example, on the second organic film 655.

The first and second organic films 653 and 655 may be deposited by any arbitrary technique. For example, these films 653 and 655 may be deposited by a plasma CVD process using a reactive gas mainly composed of perfluorodecalin. Also, hydrocarbon films or fluorine-containing hydrocarbon films, formed by plasma CVD, coating or thermal CVD, may be used as the first and second organic films 653 and 655. More specifically, the organic films 653 and 655 may be made of polytetrafluoroethylene, oxygen-containing polytetrafluoroethylene, polyimide fluoride or polyaryl ether.

The silicon dioxide film 654 may also be deposited by any arbitrary technique. For example, the film 654 may be deposited by a plasma CVD process.

It should be noted that a thin film showing high etch selectivity with respect to the first and second organic films 653 and 655 and the silicon dioxide film 654, i.e., a thin film etched at a sufficiently low rate (e.g., silicon nitride film), may be used instead of the titanium nitride film 656.

Figure 33B:
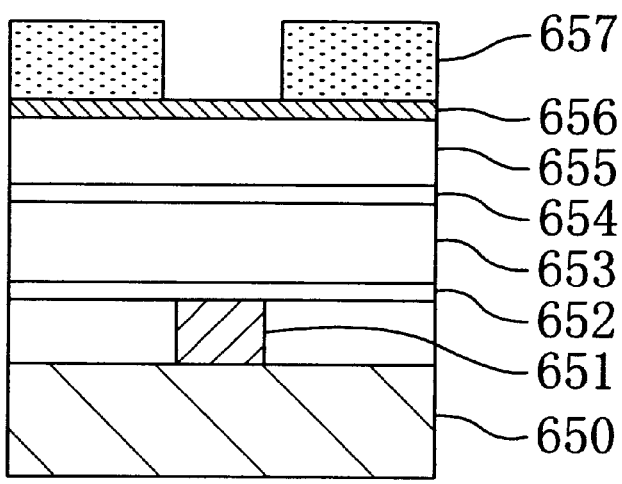
Figure 33C:
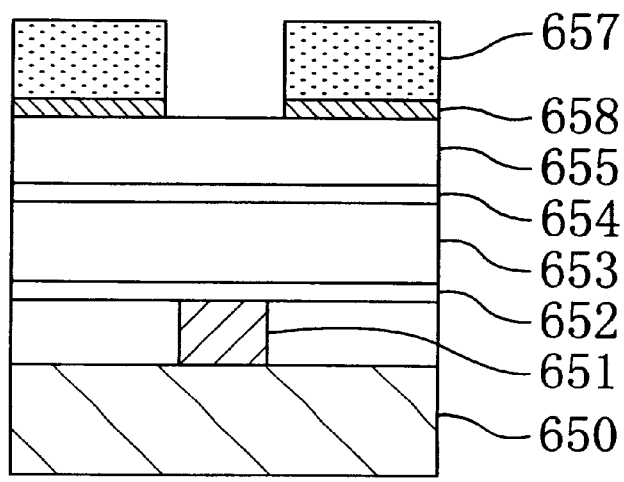

Next, as shown in FIG. 33(b), a first resist pattern 657, having openings for forming wiring grooves, is formed by lithography on the titanium nitride film 656. Thereafter, the titanium nitride film 656 is dry-etched using the first resist pattern 657 as a mask, thereby forming a mask pattern 658, having openings for forming wiring grooves, out of the titanium nitride film 656 as shown in FIG. 33(c).

Figure 34A:
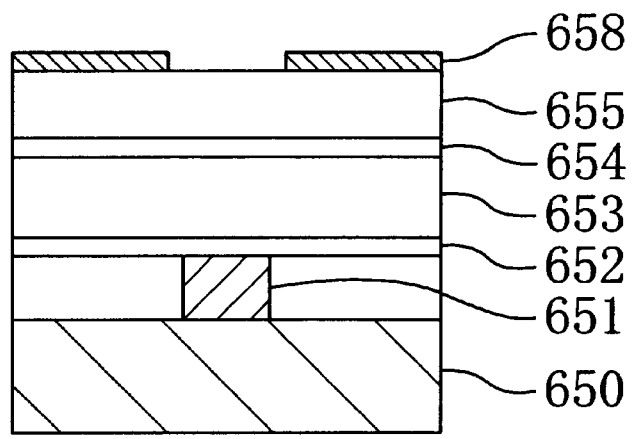
FIGS. 34(*a*) through 34(*c*) are cross-sectional views illustrating respective process steps for forming the interconnection structure in the modified example of the sixth embodiment.

Subsequently, as shown in FIG. 34(a), the first resist pattern 657 is removed by an organic parting agent, for example. In such a case, since the second organic film 655 is not exposed to oxygen plasma, the quality of the second organic film 655 does not degrade.

Figure 34B:
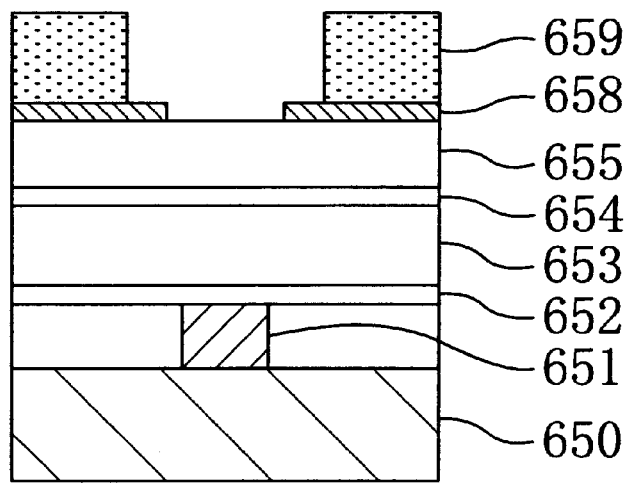

Then, as shown in FIG. 34(b), a second resist pattern 659, having openings for forming contact holes, is formed by lithography on the mask pattern 658. In this modified example of the sixth embodiment, the sizes of the openings of the second resist pattern 659 for forming contact holes are set larger than designed sizes of the contact holes in respective directions vertical and parallel to the wiring grooves for forming second metal interconnects. The reason thereof will be described later.

Figure 34C:
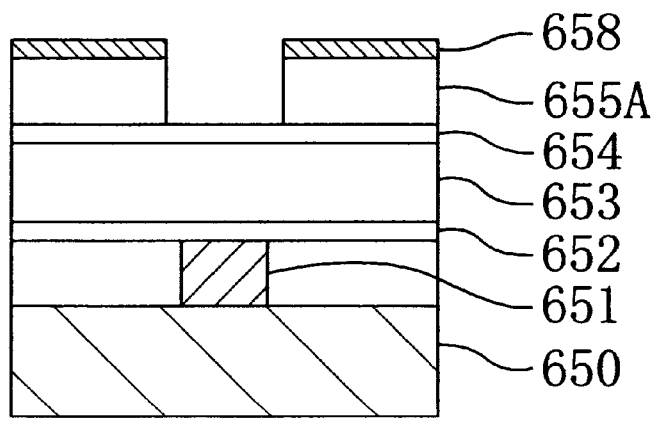
Figure 35A:
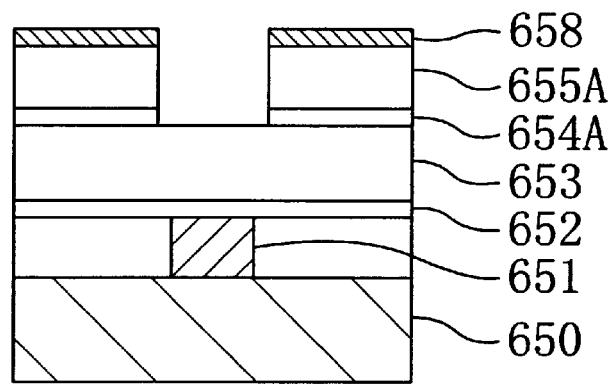
FIGS. 35(*a*) through 35(*c*) are cross-sectional views illustrating respective process steps for forming the interconnection structure in the modified example of the sixth embodiment.
Figure 35B:
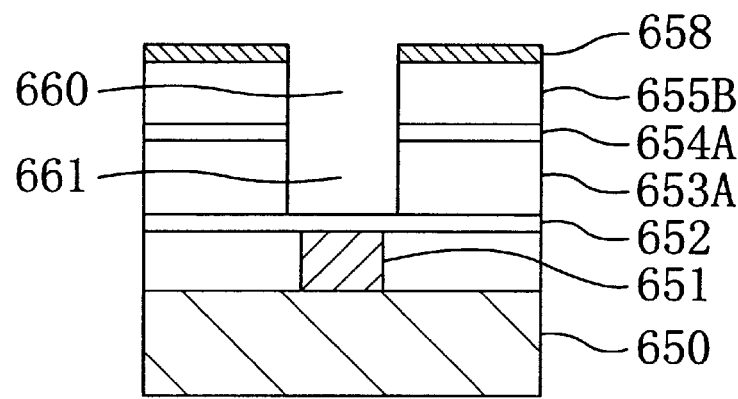
Figure 35C:
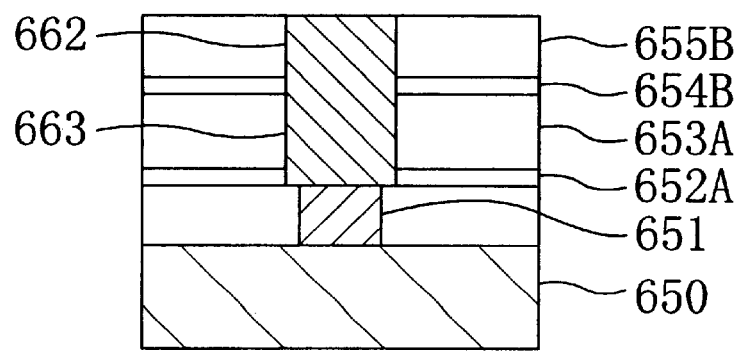

Next, the second organic film 655 is dry-etched using the second resist pattern 659 and the mask pattern 658 as a mask, thereby forming a patterned second organic film 655A having openings for forming contact holes as shown in FIG. 34(c). In this case, the second organic film 655 and the second resist pattern 659 are both mainly composed of organic components, the second organic film 655 is etched at a substantially equal rate to that of the second resist pattern 659. Thus, when the second organic film 655 is dry-etched, the second resist pattern 659 is also removed simultaneously. It should be noted that part of the second resist pattern 659 may be left in the process step of dry-etching the second organic film 655. This is because the residual second resist pattern 659 can be removed during a subsequent process step of dry-etching the first organic film 653 (see FIG. 35(*b*)).

Thereafter, the silicon dioxide film 654 is dry-etched using the patterned second organic film 655A as a mask, thereby forming a patterned second silicon dioxide film 654A having openings for forming contact holes as shown in FIG. 35(*a*).

Then, the patterned second organic film 655A and the first organic film 653 are dry-etched using the mask pattern 658 and the patterned silicon dioxide film 654A as respective masks, thereby forming a patterned second organic film 655B having wiring grooves 660 and a patterned first organic film 653A having contact holes 661 as shown in FIG. 35(*b*).

Subsequently, the patterned silicon dioxide film 654A and the silicon nitride film 652 are dry-etched using the mask pattern 658 and the patterned first organic film 653A as respective masks, thereby forming a patterned silicon dioxide film 654B having wiring grooves (see FIG. 35(*c*)) and a patterned silicon nitride film 652A having the contact holes (see FIG. 35(*c*)), and exposing the first metal interconnects 651 within the contact holes 661. Then, although not shown, an adhesion layer, made of titanium nitride, is deposited to be 50 nm thick, for example, on the wall faces of the contact holes 661 and the wiring grooves 660 as in the first embodiment. Thereafter, a metal film is deposited over the entire surface of the substrate to completely fill in the contact holes 661 and the wiring grooves 660. In this embodiment, the metal film may be made of any arbitrary metal. For example, copper, aluminum, gold, silver, nickel, cobalt, tungsten, or an alloy thereof may be used. Also, the metal film may be deposited by any arbitrary technique. For instance, plating, CVD or sputtering may be employed. Finally, respective portions of the adhesion layer, the metal film and the mask pattern 658, which are deposited on the patterned second organic film 655B, are removed by a CMP technique, for example. As a result, second metal interconnects 662 and contacts 663, connecting the first and second metal interconnects 651 and 662 together, are formed as shown in FIG. 35(*c*).

It should be noted that a multilevel interconnection structure may be formed by forming respective films, interconnects and contacts on the second metal interconnects 662 through the same process steps as those described above.

In this modified example of the sixth embodiment, the sizes of the openings of the second resist pattern 659 for forming contact holes are set larger than designed sizes of the contact holes in respective directions vertical and parallel to the wiring grooves for forming the second metal interconnects. Accordingly, even if the openings of the second resist pattern 659 for forming contact holes have misaligned with the openings of the mask pattern 658 for forming wiring grooves, the openings of the patterned second organic film 655A for forming contact holes can be formed to be self-aligned with the openings of the mask pattern 658 for forming wiring grooves. This is because the openings of the patterned second organic film 655A for forming contact holes are formed in respective regions where the openings of the second resist pattern 659 for forming contact holes overlap with corresponding openings of the mask pattern 658 for forming wiring grooves. Accordingly, the connection between the contacts 663 and the second metal interconnects 662 is ensured.

In addition, the size of the openings of the second resist pattern 659 for forming contact holes is also extended in the direction parallel to the wiring grooves for forming second metal interconnects. Thus, the contact area between the contacts 663 and the second metal interconnects 662 expands.

As a result, the contacts 663 can connect the first and second metal interconnects 651 and 662 together with a lot more certainty.

What is claimed is:

1. A method for forming an interconnection structure, comprising the steps of:

a) forming a first insulating film over lower-level metal interconnects;

b) forming a second insulating film, having a different composition than that of the first insulating film, over the first insulating film;

c) forming a third insulating film, having a different composition than that of the second insulating film, over the second insulating film;

d) forming a thin film over the third insulating film;

e) forming a first resist pattern on the thin film, the first resist pattern having openings for forming wiring grooves;

f) etching the thin film using the first resist pattern as a mask, thereby forming a mask pattern out of the thin film to have the openings for forming wiring grooves;

g) forming a second resist pattern on the third insulating film, the second resist pattern having openings for forming contact holes;

h) dry-etching the third insulating film under such conditions that the third insulating film and the first and second resist patterns are etched at a relatively high rate and that the second insulating film is etched at a relatively low rate, thereby patterning the third insulating film to have the openings for forming contact holes and removing the first and second resist patterns either entirely or partially with respective lower parts thereof left;

i) dry-etching the second insulating film using the patterned third insulating film as a mask under such conditions that the second insulating film is etched at a relatively high rate and that the first and third insulating films are etched at a relatively low rate, thereby patterning the second insulating film to have the openings for forming contact holes;

j) dry-etching the third and first insulating films using the mask pattern and the patterned second insulating film as respective masks under such conditions that the first and third insulating films are etched at a relatively high rate and that the mask pattern and the second insulating film are etched at a relatively low rate, thereby forming wiring grooves and contact holes in the third and first insulating films, respectively; and k) filling in the wiring grooves and the contact holes with a metal film, thereby forming upper-level metal interconnects and contacts connecting the lower- and upper-level metal interconnects together.

2. The method of claim 1, further comprising the step of forming a metal adhesion layer over part of the third insulating film exposed inside the wiring grooves and part of the first insulating film exposed inside the contact holes between the steps j) and k).

3. The method of claim 1, wherein the third insulating film is mainly composed of an organic component.

4. The method of claim 3, wherein the step c) includes forming the third insulating film by a CVD process using a reactive gas containing perfluorodecalin.

5. The method of claim 3, wherein the first insulating film is mainly composed of an organic component.

6. The method of claim 5, further comprising the step of forming an adhesion layer over part of the third insulating film exposed inside the wiring grooves and part of the first insulating film exposed inside the contact holes by a plasma process using a reactive gas containing nitrogen between the steps j) and k).

7. The method of claim 3, wherein the step a) includes forming the first insulating film by a CVD process using a reactive gas containing perfluorodecalin.

8. A method for forming an interconnection structure, comprising the steps of:
   a) forming a first insulating film over lower-level metal interconnects;
   b) forming a second insulating film, having a different composition than that of the first insulating film, over the first insulating film;
   c) forming a third insulating film, having a different composition than that of the second insulating film, over the second insulating film;
   d) forming a thin film over the third insulating film;
   e) forming a first resist pattern on the thin film, the first resist pattern having openings for forming wiring grooves;
   f) etching the thin film using the first resist pattern as a mask, thereby forming a mask pattern out of the thin film to have the openings for forming wiring grooves;
   g) forming a second resist pattern on the third insulating film, the second resist pattern having openings for forming contact holes;
   h) dry-etching the third insulating film using the first and second resist patterns as a mask under such conditions that the third insulating film is etched at a relatively high rate and that the second insulating film and the first and second resist patterns are etched at a relatively low rate, thereby patterning the third insulating film to have the openings for forming contact holes;
   i) dry-etching the second insulating film using the first and second resist patterns as a mask under such conditions that the second insulating film is etched at a relatively high rate and that the first and third insulating films and the first and second resist patterns are etched at a relatively low rate, thereby patterning the second insulating film to have the openings for forming contact holes;
   j) removing the first and second resist patterns;
   k) dry-etching the third and first insulating films using the mask pattern and the patterned second insulating film as respective masks under such conditions that the first and third insulating films are etched at a relatively high rate and that the mask pattern and the second insulating film are etched at a relatively low rate, thereby forming wiring grooves and contact holes in the third and first insulating films, respectively; and
   l) filling in the wiring grooves and the contact holes with a metal film, thereby forming upper-level metal interconnects and contacts connecting the lower- and upper-level metal interconnects together.

9. The method of claim 8, wherein the third insulating film is a low-dielectric-constant SOG film with a siloxane skeleton.

10. A method for forming an interconnection structure, comprising the steps of:
   a) forming a first insulating film over lower-level metal interconnects;
   b) forming a second insulating film, having a different composition than that of the first insulating film, over the first insulating film;
   c) forming a third insulating film, having a different composition than that of the second insulating film, over the second insulating film;
   d) forming a fourth insulating film, having a different composition than that of the third insulating film, over the third insulating film;
   e) forming a thin film over the fourth insulating film;
   f) forming a first resist pattern on the thin film, the first resist pattern having openings for forming wiring grooves;
   g) etching the thin film using the first resist pattern as a mask, thereby forming a mask pattern out of the thin film to have the openings for forming wiring grooves;
   h) removing the first resist pattern and then forming a second resist pattern on the fourth insulating film and the mask pattern, the second resist pattern having openings for forming contact holes;
   i) dry-etching the fourth insulating film using the second resist pattern and the mask pattern as a mask, thereby patterning the fourth insulating film to have the openings for forming contact holes;
   j) dry-etching the third insulating film using the patterned fourth insulating film as a mask, thereby patterning the third insulating film to have the openings for forming contact holes;
   k) dry-etching the patterned fourth insulating film and the second insulating film using the mask pattern and the patterned third insulating film as respective masks, thereby forming wiring grooves in the patterned fourth insulating film and patterning the second insulating film to have the openings for forming contact holes;
   l) dry-etching the patterned third insulating film and the first insulating film using the mask pattern and the patterned second insulating film as respective masks, thereby forming the wiring grooves and the contact holes in the patterned third insulating film and the first insulating film, respectively; and
   m) filling in the wiring grooves and the contact holes with a metal film, thereby forming upper-level metal interconnects and contacts connecting the lower- and upper-level metal interconnects together.

11. The method of claim 10, wherein at least one of the first and third insulating films is mainly composed of an organic component.

12. The method of claim 10, wherein a size of the openings of the second resist pattern for forming contact holes is larger than a designed size of the contact holes in a direction vertical to a direction in which the upper-level metal interconnects extend.

13. A method for forming an interconnection structure, comprising the steps of:
   a) forming a first insulating film over lower-level metal interconnects;
   b) forming a second insulating film, having a different composition than that of the first insulating film, over the first insulating film;
   c) forming a third insulating film, having a different composition than that of the second insulating film, over the second insulating film;

d) forming a thin film over the third insulating film;

e) forming a first resist pattern on the thin film, the first resist pattern having openings for forming wiring grooves;

f) etching the thin film using the first resist pattern as a mask, thereby forming a mask pattern out of the thin film to have the openings for forming wiring grooves;

g) removing the first resist pattern and then forming a second resist pattern on the third insulating film and the mask pattern, the second resist pattern having openings for forming contact holes;

h) dry-etching the third insulating film using the second resist pattern and the mask pattern as a mask, thereby patterning the third insulating film to have the openings for forming contact holes;

i) dry-etching the second insulating film using the patterned third insulating film as a mask, thereby patterning the second insulating film to have the openings for forming contact holes;

j) dry-etching the patterned third insulating film and the first insulating film using the mask pattern and the patterned second insulating film as respective masks, thereby forming wiring grooves and contact holes in the patterned third insulating film and the first insulating film, respectively; and k) filling in the wiring grooves and the contact holes with a metal film, thereby forming upper-level metal interconnects and contacts connecting the lower- and upper-level metal interconnects together.

14. The method of claim 13, wherein at least one of the first and third insulating films is mainly composed of an organic component.

15. The method of claim 13, wherein a size of the openings of the second resist pattern for forming contact holes is larger than a designed size of the contact holes in a direction vertical to a direction in which the upper-level metal interconnects extend.

* * * * *